(12) United States Patent
Seddon et al.

(10) Patent No.: US 9,275,957 B2
(45) Date of Patent: Mar. 1, 2016

(54) EM PROTECTED SEMICONDUCTOR DIE

(71) Applicants: Michael J. Seddon, Gilbert, AZ (US); Francis J. Carney, San Tan Valley, AZ (US); Gordon M. Grivna, Mesa, AZ (US)

(72) Inventors: Michael J. Seddon, Gilbert, AZ (US); Francis J. Carney, San Tan Valley, AZ (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/061,153

(22) Filed: Oct. 23, 2013

(65) Prior Publication Data

US 2014/0048917 A1    Feb. 20, 2014

Related U.S. Application Data

(62) Division of application No. 12/689,137, filed on Jan. 18, 2010.

(51) Int. Cl.

| H01L 23/48 | (2006.01) |
|---|---|
| H01L 23/52 | (2006.01) |
| H01L 29/40 | (2006.01) |
| H01L 23/552 | (2006.01) |
| H01L 21/76 | (2006.01) |
| H01L 21/4763 | (2006.01) |
| H01L 21/44 | (2006.01) |
| H01L 21/302 | (2006.01) |
| H01L 21/461 | (2006.01) |

(Continued)

(52) U.S. Cl.
CPC ........ *H01L 23/552* (2013.01); *H01L 21/76898* (2013.01); *H01L 21/78* (2013.01); *H01L 23/481* (2013.01); *H01L 23/60* (2013.01); *H01L 21/31144* (2013.01); *H01L 23/3114* (2013.01); *H01L 2224/0401* (2013.01); *H01L 2924/13091* (2013.01)

(58) Field of Classification Search
CPC ................. H01L 2924/00; H01L 2924/00014; H01L 2224/48091; H01L 2924/01079; H01L 2924/01078; H01L 21/76898; H01L 21/78; H01L 23/3114; H01L 23/481; H01L 23/60; H01L 23/552; H01L 21/31144; H01L 2924/13091; H01L 2224/0401
USPC .......... 257/659, 700, E21.548, E21.549, 750, 257/774, E23.011, E21.294; 438/405, 652, 438/731, 622, 637, 640

See application file for complete search history.

(56) References Cited

U.S. PATENT DOCUMENTS

| 4,720,739 A | * | 1/1988 | Beasom .................... 257/374 |
| 4,820,377 A | | 4/1989 | Davis et al. |

(Continued)

FOREIGN PATENT DOCUMENTS

| JP | 03205831 A | * | 9/1991 | ............ H01L 21/331 |
| JP | 05-267449 | | 10/1993 | |

(Continued)

OTHER PUBLICATIONS

Office Action for counterpart Japanese Application No. P2011-007523, dated Oct. 14, 2014, 7 pages.

(Continued)

*Primary Examiner* — Teresa M Arroyo
(74) *Attorney, Agent, or Firm* — Robert F. Hightower

(57) ABSTRACT

In one embodiment, a semiconductor die is formed to have sloped sidewalls. A conductor is formed on the sloped sidewalls.

15 Claims, 18 Drawing Sheets

(51) Int. Cl.
*H01L 21/768* (2006.01)
*H01L 21/78* (2006.01)
*H01L 23/60* (2006.01)
*H01L 21/311* (2006.01)
*H01L 23/31* (2006.01)

(56) References Cited

U.S. PATENT DOCUMENTS

| | | | |
|---|---|---|---|
| 4,954,458 A * | 9/1990 | Reid | 438/109 |
| 5,075,253 A | 12/1991 | Sliwa, Jr. | |
| 5,717,247 A * | 2/1998 | Koh et al. | 257/686 |
| 5,856,705 A | 1/1999 | Ting | |
| 6,030,885 A | 2/2000 | Bothra | |
| 6,214,703 B1 | 4/2001 | Chen et al. | |
| 6,274,198 B1 * | 8/2001 | Dautartas | 438/29 |
| 6,342,724 B1 | 1/2002 | Wark et al. | |
| 6,406,979 B2 | 6/2002 | Fischer et al. | |
| 6,528,864 B1 | 3/2003 | Arai | |
| 6,611,002 B2 * | 8/2003 | Weeks et al. | 257/94 |
| 6,686,225 B2 | 2/2004 | Wachtler | |
| 6,844,241 B2 * | 1/2005 | Halahan et al. | 438/454 |
| 7,129,114 B2 | 10/2006 | Akram | |
| 7,253,477 B2 | 8/2007 | Loechelt et al. | |
| 7,309,623 B2 | 12/2007 | Tan et al. | |
| 7,329,599 B1 * | 2/2008 | Wirbeleit et al. | 438/627 |
| 7,335,576 B2 | 2/2008 | David et al. | |
| 7,880,307 B2 * | 2/2011 | Farnworth et al. | 257/774 |
| 2002/0084513 A1 * | 7/2002 | Siniaguine | 257/621 |
| 2002/0117681 A1 * | 8/2002 | Weeks et al. | 257/106 |
| 2002/0180027 A1 * | 12/2002 | Yamaguchi et al. | 257/700 |
| 2003/0207579 A1 | 11/2003 | Rattner et al. | |
| 2004/0130002 A1 * | 7/2004 | Weeks et al. | 257/622 |
| 2005/0084996 A1 | 4/2005 | Harper | |
| 2005/0104165 A1 | 5/2005 | Ishio et al. | |
| 2005/0156162 A1 * | 7/2005 | Kim et al. | 257/40 |
| 2005/0196957 A1 * | 9/2005 | Kameyama et al. | 438/637 |
| 2006/0030078 A1 | 2/2006 | Jiang et al. | |
| 2006/0118515 A1 | 6/2006 | Dolechek et al. | |
| 2006/0145789 A1 * | 7/2006 | Yoshida et al. | 333/246 |
| 2006/0244096 A1 | 11/2006 | Sekiya | |
| 2007/0026676 A1 * | 2/2007 | Li et al. | 438/689 |
| 2007/0087524 A1 | 4/2007 | Montgomery | |
| 2007/0132034 A1 | 6/2007 | Curello et al. | |
| 2007/0249178 A1 | 10/2007 | Ogihara | |
| 2007/0267754 A1 * | 11/2007 | Kirby et al. | 257/774 |
| 2008/0001260 A1 * | 1/2008 | Zhu et al. | 257/622 |
| 2008/0006837 A1 * | 1/2008 | Park et al. | 257/98 |
| 2008/0099900 A1 | 5/2008 | Oganesian et al. | |
| 2009/0032928 A1 | 2/2009 | Chiang et al. | |
| 2009/0065904 A1 | 3/2009 | Wang | |
| 2009/0278237 A1 * | 11/2009 | Cooney et al. | 257/621 |
| 2009/0298231 A1 | 12/2009 | Carothers | |
| 2009/0302480 A1 * | 12/2009 | Birner et al. | 257/774 |
| 2010/0258904 A1 * | 10/2010 | Li et al. | 257/532 |

FOREIGN PATENT DOCUMENTS

| | | |
|---|---|---|
| JP | 05-267559 | 10/1993 |
| JP | 11-168172 | 6/1999 |
| JP | 2003-347441 | 12/2003 |
| JP | 2005-294842 | 10/2005 |
| JP | 2009-164263 | 7/2009 |
| WO | WO 01/56063 A2 | 8/2001 |
| WO | WO 01/56063 A3 | 8/2001 |
| WO | WO2004066382 A1 | 8/2004 |
| WO | WO2007007883 A1 | 1/2007 |
| WO | WO2008081968 A1 | 7/2008 |
| WO | WO2009063620 A1 | 5/2009 |

OTHER PUBLICATIONS

Office Action and Search Report dated May 21, 2015 for counterpart Taiwanese Patent Application No. 099147404, 10 pages.

* cited by examiner

US 9,275,957 B2

EM PROTECTED SEMICONDUCTOR DIE

The present application is a divisional of United States patent application entitled METHOD OF FORMING AN EM PROTECTED SEMICONDUCTOR DIE, having application Ser. No. 12/689,137 and filed on Jan. 18, 2010, which is hereby incorporated herein by reference, and priority thereto for common subject matter is hereby claimed. Additionally, the present application is related to a United States patent application entitled METHOD OF FORMING AN EM PROTECTED SEMICONDUCTOR DIE, having Michael Seddon as an inventor and application Ser. No. 12/689,134, related to a United States patent application entitled SEMICONDUCTOR DIE SINGULATION METHOD, having Gordon Grivna as an inventor and now U.S. Pat. No. 7,989,319, related to a United States patent application entitled SEMICONDUCTOR DIE SINGULATION METHOD, having Gordon Grivna as an inventor and now U.S. Pat. No. 8,012,857, related to a United States patent application entitled METHOD OF FORMING A SEMICONDUCTOR DIE, having Gordon Grivna as an inventor and application Ser. No. 12/689,117, and related to a United States patent application entitled METHOD OF FORMING A SEMICONDUCTOR DIE, having Gordon Grivna as an inventor and now U.S. Pat. No. 8,384,231, all of which are filed concurrently herewith, have at least one common inventor, a common assignee, and are hereby incorporated herein by reference.

BACKGROUND OF THE INVENTION

The present invention relates, in general, to electronics, and more particularly, to methods of forming semiconductors.

In the past, the semiconductor industry utilized various methods and structures to form semiconductor devices that had some degree of protection from electro-magnetic (EM) interference or EMI. Typically, semiconductor die were encapsulated in packages to form a semiconductor device that reduced the semiconductor device's susceptibility to high frequency signals. The packages typically included metal in the packaging material or adhered to the packaging material in order to provide an electro-magnetic (EM) shield for the semiconductor die. The metal in the packaging material formed a shielded package. Generally, the shielded package was manufactured to an almost completed stage, then, the semiconductor die was assembled into the shielded package. The manufacturing of the shield package increased the packaging costs and increased the cost of the resulting completed semiconductor device.

Accordingly, it is desirable to have a method of forming die from a semiconductor wafer that reduces the cost of the assembled EM protected packaged device, that forms a more EM protected semiconductor die, and that has a low cost for the EM protected semiconductor die.

Figure 1:
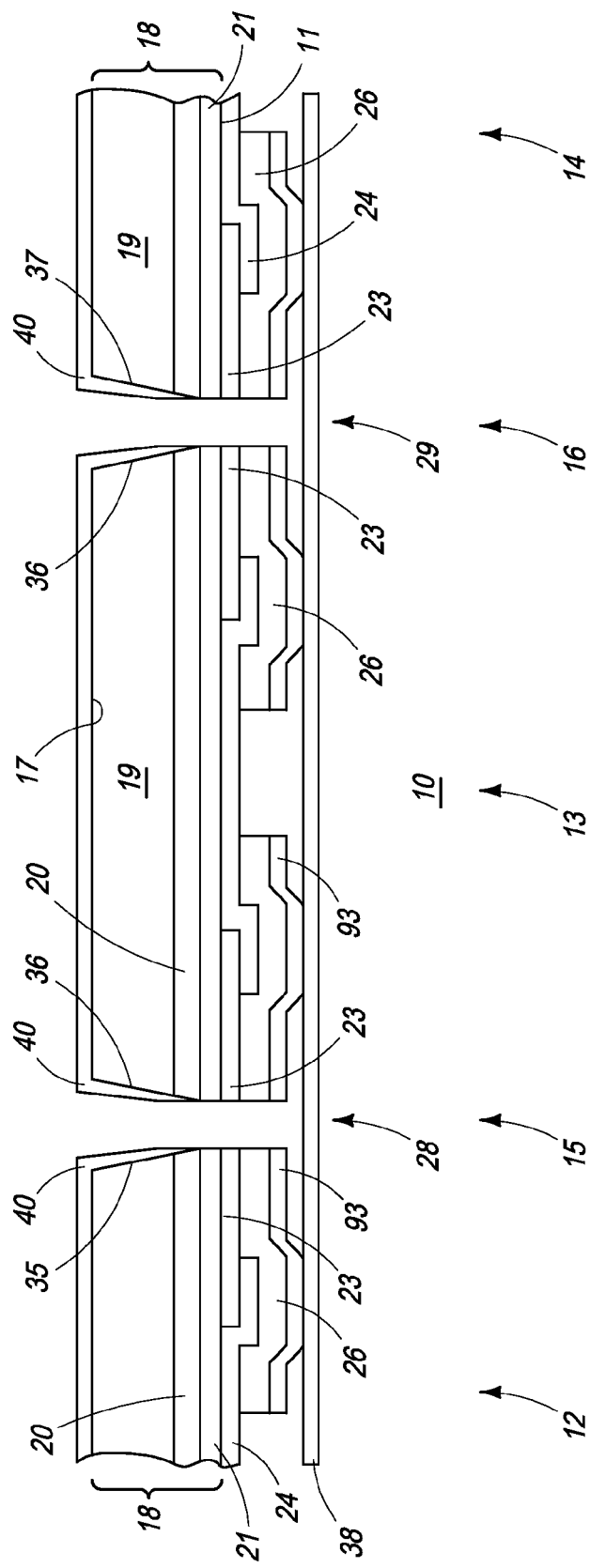
FIG. 1 illustrates an enlarged cross-sectional view of an embodiment of a portion of a plurality of EM protected semiconductor die in accordance with the present invention.

For simplicity and clarity of the illustration, elements in the figures are not necessarily to scale, and the same reference numbers in different figures denote the same elements. Additionally, descriptions and details of well-known steps and elements are omitted for simplicity of the description. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

It will be appreciated by those skilled in the art that the use of the word approximately or substantially means that a value of an element has a parameter that is expected to be very close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described.

DETAILED DESCRIPTION OF THE DRAWINGS

As will been seen further hereinafter, the present description includes methods of forming a semiconductor die that includes forming a conductor as an EM shield on sidewalls of the semiconductor die.

One example embodiment of the method of forming an EM protected semiconductor die may include providing a semiconductor wafer having a semiconductor substrate and having a plurality of semiconductor die formed on the semiconductor substrate and separated from each other by portions of the semiconductor substrate where singulation lines are to be formed; etching a singulation line opening through the portions of the semiconductor substrate from a first surface of the semiconductor substrate thereby creating a space between the plurality of semiconductor die, the singulation lines forming sloped sidewalls for a semiconductor die of the plurality of semiconductor die wherein a top surface of the semiconductor die has a greater width than a bottom surface of the semiconductor die; and forming a conductor on the sloped sidewalls of the semiconductor die.

The method can further include attaching the semiconductor die to a first common carrier, inverting the semiconductor die so that the first common carrier provides support for the semiconductor die, and forming the conductor on the sloped sidewalls and on the bottom surface of the semiconductor die.

The method may also include attaching the semiconductor die to a second common carrier with the bottom surface of the semiconductor die adjacent to the second common carrier, applying the first common carrier to a top side of the semiconductor die prior to the step of inverting the semiconductor die so that the first common carrier provides support for the semiconductor die.

As will be seen further hereinafter, another embodiment of a method of forming a semiconductor die can comprise: providing a semiconductor wafer having a semiconductor substrate and having a plurality of semiconductor die formed on the semiconductor substrate and separated from each other by portions of the semiconductor substrate where singulation lines are to be formed; separating a first semiconductor die of the plurality of semiconductor die from other semiconductor die of the plurality of semiconductor die wherein the step of separating also forms sidewalls on at least the first semiconductor die wherein at least one of the sidewalls is a sloped sidewall so that a top surface of the first semiconductor die has a greater width than a bottom surface of the first semiconductor die; and forming a conductor on the sloped sidewall of the first semiconductor die.

The method may also include forming the conductor on the bottom surface of the first semiconductor die and onto the sloped sidewall.

Additionally, the method can include using a series of isotropic etches to wherein each isotropic etch extends the singulation line opening into the semiconductor substrate while also successively increasing a width of the singulation line opening.

Furthermore, an example of an embodiment of a semiconductor die may comprise: a semiconductor die having a top surface, a bottom surface, and exterior sidewalls extending from the top surface to the bottom surface wherein at least one of the exterior sidewalls is a sloped sidewall so that a width of the top surface is greater than a width of the bottom surface; and a conductor on the sloped sidewall of the semiconductor die The example of the embodiment of the EM protected semiconductor die may also include the conductor on the bottom surface of the semiconductor die.

FIG. 1 illustrates an enlarged cross-sectional portion of an example of an embodiment of a plurality of semiconductor die 12, 13, and 14 that are shown in an inverted or flipped over position with a top surface 11 of a substrate 18, on which die 12-14 are formed, facing downward. As will be seen further hereinafter, die 12, 13, and 14 include a conductor 40 that is formed on a bottom and on sidewalls 35-37 of respective die 12, 13, and 14. In the preferred embodiment, conductor 40 is a metal including Au or multi-layer metals such as Ti/NiV/Au or Ti/Ni/Au or TiW/Au or other well-known multi-layer metals.

Figure 2:
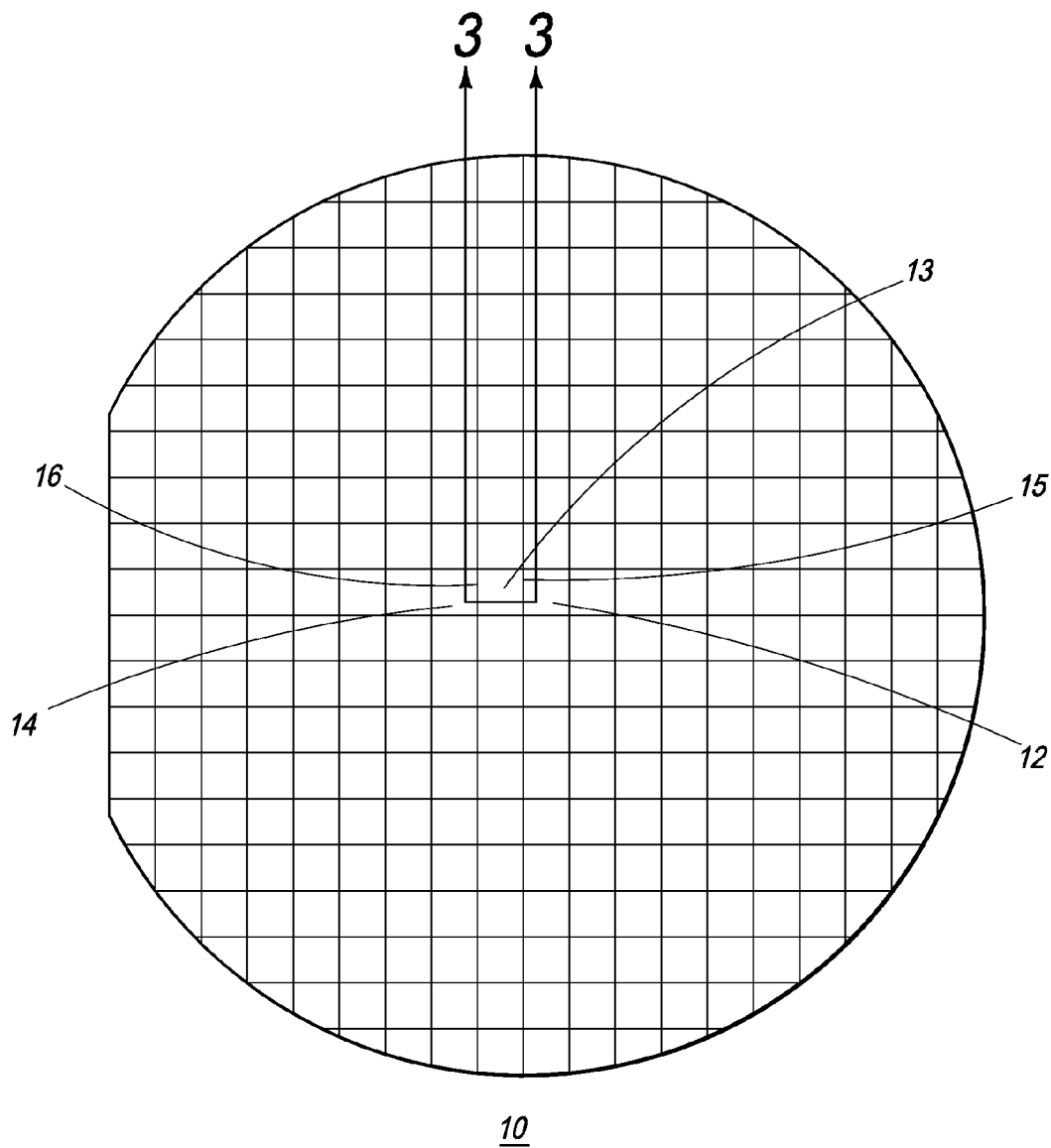
FIG. 2 illustrates a reduced plan view of an embodiment of a semiconductor wafer that includes the plurality of semiconductor die of FIG. 1 in accordance with the present invention.

FIG. 2 illustrates a reduced plan view of an example of a semiconductor wafer 10 on which a plurality of semiconductor die, including die 12-14, may be formed. Die 12-14 are spaced apart from each other on wafer 10 by spaces or portions of wafer 10 in which singulation regions or singulation lines are to be formed, such as singulation lines 15 and 16. As is well known in the art, all of the plurality of semiconductor die on wafer 10 generally are separated from each other on all sides by areas where singulation regions or singulation lines such as lines 15 and 16 are to be formed.

Figure 3:
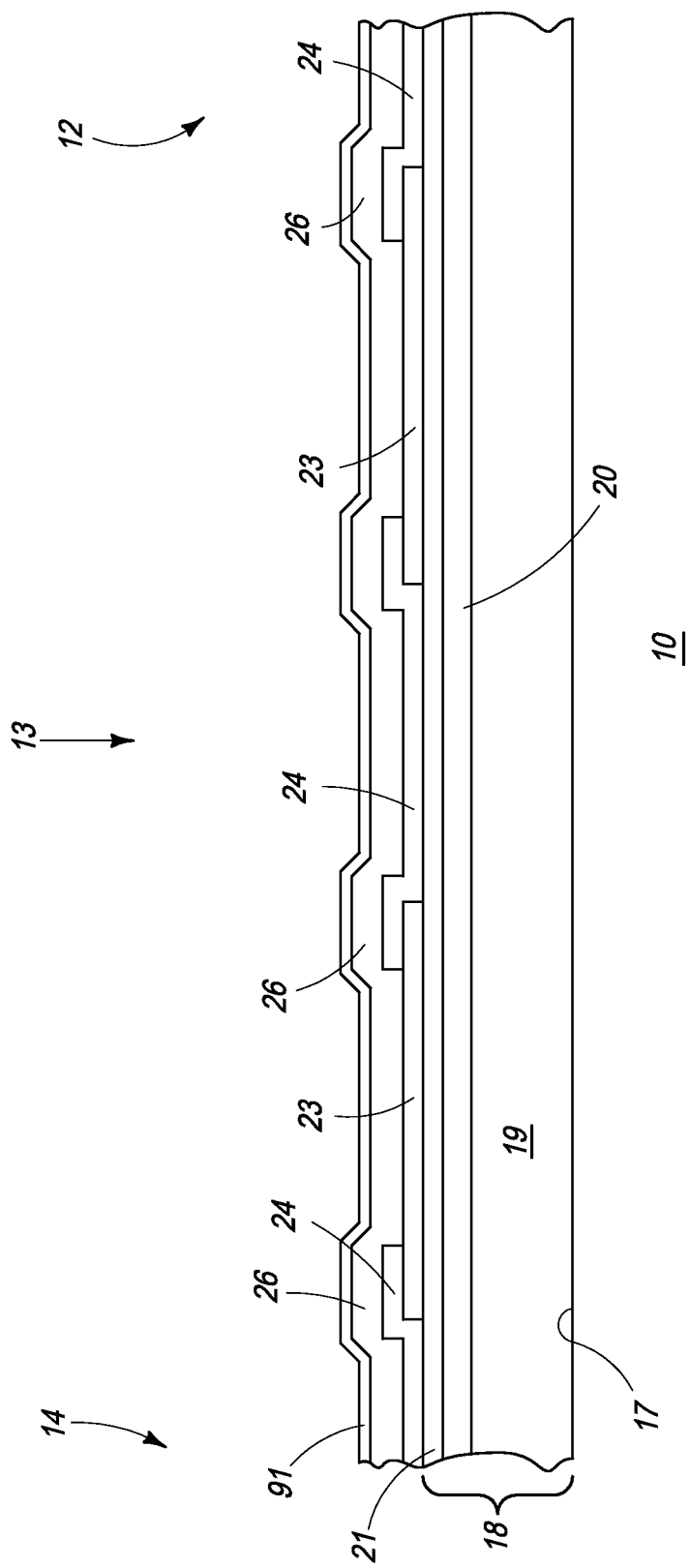
FIG. 3 illustrates an enlarged cross-sectional view of an example of an embodiment of a portion of the semiconductor wafer of FIG. 1 at a stage in an example of a process of forming the semiconductor die of FIG. 1 in accordance with the present invention.

FIG. 3 illustrates a stage in an embodiment of an example of a method of forming semiconductor die 12-14. As will be seen further hereinafter, a singulation method used to singulate die 12-14 forms angled sidewalls for die 12-14 such that the lateral width of one die, such as die 13, is greater at top surface the die, such as at top surface 11, than it is at the bottom surface of the die, such as at a bottom surface 17 of substrate 18.

The view illustrated in FIG. 3 is an enlarged cross-sectional portion of wafer 10 of FIG. 2 taken along section line 3-3. For clarity of the drawings and of the description, this section line 3-3 is illustrated to cross-section only die 13 and portions of dice 12 and 14. Die 12-14 may be any type of semiconductor die including diode, a vertical transistor, a lateral transistor, or an integrated circuit that includes a variety of types of semiconductor devices. Die 12-14 generally include a semiconductor substrate 18 that may have doped regions formed within substrate 18 in order to form active and passive portions of the semiconductor die. The cross-sectional portion illustrated in FIG. 3 is taken along a contact pad 24 of each of dice 12-14. Contact pad 24 generally is a metal that is formed on the semiconductor die in order to provide electrical contact between the semiconductor die and elements external to the semiconductor die. For example, contact pad 24 may be formed to receive a bonding wire that subsequently may be attached to pad 24 or may be formed to receive a solder ball or other type of interconnect structure that may subsequently be attached to pad 24. Substrate 18 includes a bulk substrate 19 that has an epitaxial layer 20 formed on a surface of bulk substrate 19. A portion of epitaxial layer 20 may be doped to form a doped region 21 that is used for forming active and passive portions of semiconductor die 12, 13, or 14. Layer 20 and/or region 21 may be omitted in some embodiments or may be in other regions of die 12-14. Typically, a dielectric 23 is formed on a top surface 11 of substrate 18 in order to isolate pad 24 from other portions of the individual semiconductor die and to isolate each pad 24 from the adjacent semiconductor die. Dielectric 23 usually is a thin layer of silicon dioxide that is formed on the surface of substrate 18 but may be other dielectrics in other embodiments. Contact pad 24 generally is a metal with a portion of contact pad 24 electrically contacting substrate 18 and another portion formed on a portion of dielectric 23. After die 12-14 are formed including any internal active or passive regions of transistors or other circuitry, and after the metal contacts and any associated inter-layer dielectrics (not shown) are formed, a dielectric 26 is formed over all of the plurality of semiconductor die. Dielectric 26 typically functions as a passivation layer for wafer 10 and for each individual semiconductor die 12-14. Dielectric 26 usually is formed on the entire surface of wafer 10 such as by a blanket dielectric deposition. The thickness of dielectric 26 generally is greater than the thickness of dielectric 23.

In one example embodiment of a method of singulating die 12-14, a singulation mask is formed to facilitate forming openings through substrate 18 without etching underlying layers such as portions of dielectric 26. In the preferred embodiment, the singulation mask is formed from aluminum nitride (AlN). In this preferred embodiment, an ALN layer 91 is formed at least on dielectric 26. Layer 91 generally is applied to cover all of wafer 10.

Figure 4:
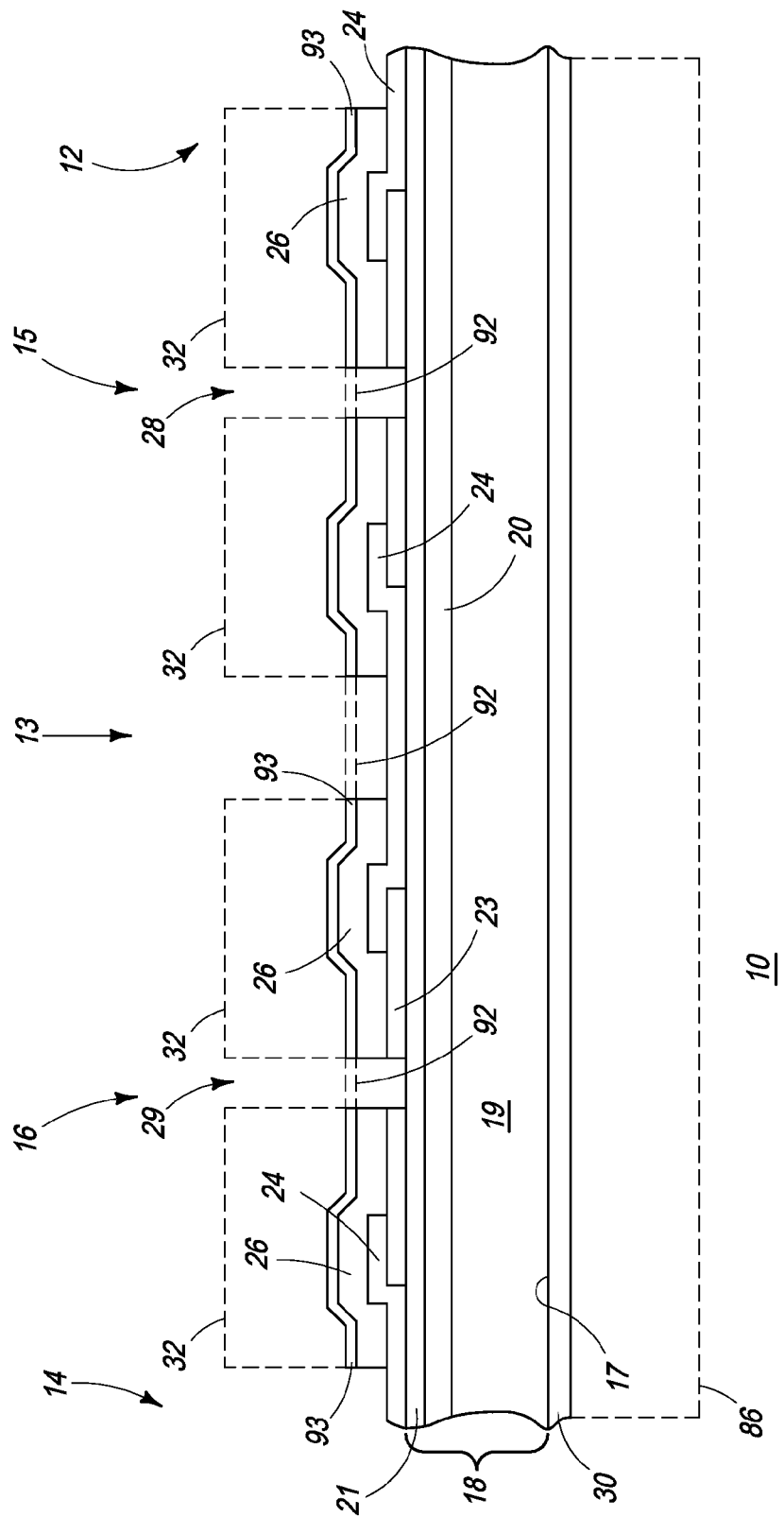
FIG. 4 illustrates a subsequent stage in the example process of forming the semiconductor die from of FIG. 1 in accordance with the present invention.

FIG. 4 illustrates the cross-sectional portion of wafer 10 in FIG. 3 at a subsequent stage in the example of a embodiment of a method of singulating die 12-14 from wafer 10.

In an example embodiment of a method of singulating die 12-14, a singulation mask is formed to facilitate forming openings through substrate 18 without etching underlying layers such as portions of dielectric 26. In the preferred embodiment, the singulation mask is formed from aluminum nitride (AlN). In this preferred embodiment, an AlN layer 91 is formed at least on dielectric 26. Layer 91 generally is applied to cover all of wafer 10. After AlN layer 91 is formed, mask 32 may be applied to the surface of substrate 18 and patterned to form openings that expose portions of dielectric 26 overlying each pad 24 and also overlying portions of wafer 10 where the singulation lines, such as singulation lines 15 and 16, are to be formed.

In order to form mask 32, a photographic mask material is applied to wafer 10 and then exposed to light, such as ultraviolet light, to change the chemical composition of the exposed portion of the mask material in order to form mask 32 having openings overlying the location where the singulation lines are to be formed and also where pads 24 are to be formed. A developer solution is then used to remove the unexposed portions of the mask material thereby leaving mask 32 with openings 28 and 29 overlying the location where respective singulation lines 15 and 16 are to be formed. It has been found that using an ammonium hydroxide based developer solution also results in the developer solution removing the portion of AlN layer 91 that underlies the unexposed portions of the mask material. The removed portion of layer 91 is illustrated by dashed lines 92, and the remaining portions of layer 91 are identified as AlN 93. AlN 93 functions as the singulation mask as will be seen further hereinafter Subsequently, dielectrics 26 and 23 are etched through the openings in mask 32 and AlN 93 to expose the underlying surface of pads 24 and of substrate 18. The openings that are formed through AlN 93 and dielectrics 26 and 23 in the region where the singulation lines, such as lines 15 and 16, are to be formed function as singulation openings 28 and 29. The openings that are formed through dielectric 26 overlying pads 24 function as contact openings.

The etching process preferably is performed with an anisotropic process that selectively etches dielectrics faster than it etches metals. The etching process generally etches dielectrics at least ten (10) times faster that it etches metals. The material used for substrate 18 preferably is silicon and the material used for dielectric 26 preferably is silicon dioxide or silicon nitride. The material of dielectric 26 may also be other dielectric materials that can be etched without etching the material of pads 24, such as polyimide. The metal of pads 24 functions as an etch stop that prevents the etching from removing the exposed portions of pads 24. In the preferred embodiment, a fluorine based anisotropic reactive ion etch process is used. Mask 32 protects AlN 93 during this etching operation.

After forming the openings through dielectrics 26 and 23, mask 32 usually is removed as illustrated by the dashed lines. In some embodiments, mask 32 may be used instead of or along with mask 32. Substrate 18 generally is thinned to remove material from bottom surface 17 of substrate 18 and reduce the thickness of substrate 18 as illustrated by dashed lines 86. Generally, substrate 18 is thinned to a thickness that is no greater than about twenty five to two hundred (25 to 200) microns and preferably is between about fifty to two hundred (50-200) microns. Such thinning procedures are well known to those skilled in the art. Thereafter, wafer 10 usually is attached to a common carrier substrate or common carrier such as a transport tape or carrier tape 30 that facilitates supporting wafer 10 for subsequent steps of the singulation method.

Figure 5:
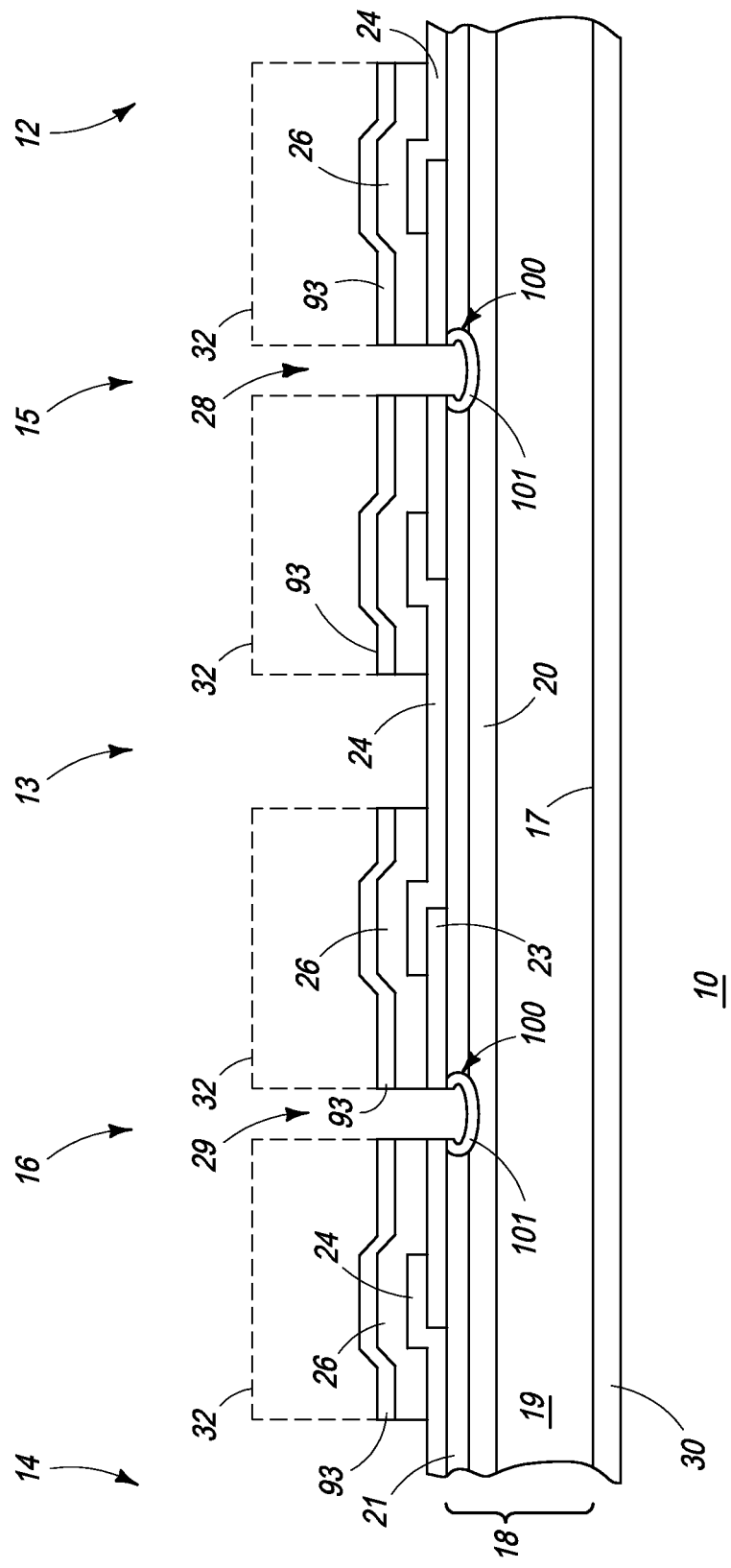
FIGS. 5-9 illustrate subsequent stages in the example process of forming the semiconductor die of FIG. 1 in accordance with the present invention.

FIG. 5 illustrates wafer 10 at a subsequent stage in the example embodiment of the alternate method of singulating semiconductor die 12-14 from wafer 10. AlN 93 is used as a mask to etch substrate 18 through singulation openings 28 and 29. Subsequent to exposing the surface of substrate 18, substrate 18 and any exposed pads 24 are etched with an isotropic etching process that selectively etches silicon at a much higher rate than dielectrics or metals, generally at least fifty (50) and preferably at least one hundred (100) times faster. Typically, a down-stream etcher with a fluorine chemistry is used for the etch. For example, wafer 10 may etched in an Alcatel deep reactive ion etch system using full isotropic etching. The etch process is performed to extend openings 28 and 29 into substrate 18 to a depth that extends the width of the openings laterally while also extending the depth to form an opening 100 in substrate 18. Because the process is used to form angled sidewalls for die 12-14, multiple isotropic etches will be used to successively increase the width of openings 28 and 29 as the depth of the openings extends into substrate 18. The isotropic etch is terminated after the width of opening 100 is greater than the width of openings 28 and 29 in dielectrics 23 and 26.

Thereafter, a carbon based polymer 101 is applied to the portion of substrate 18 that is exposed within opening 100.

Figure 6:
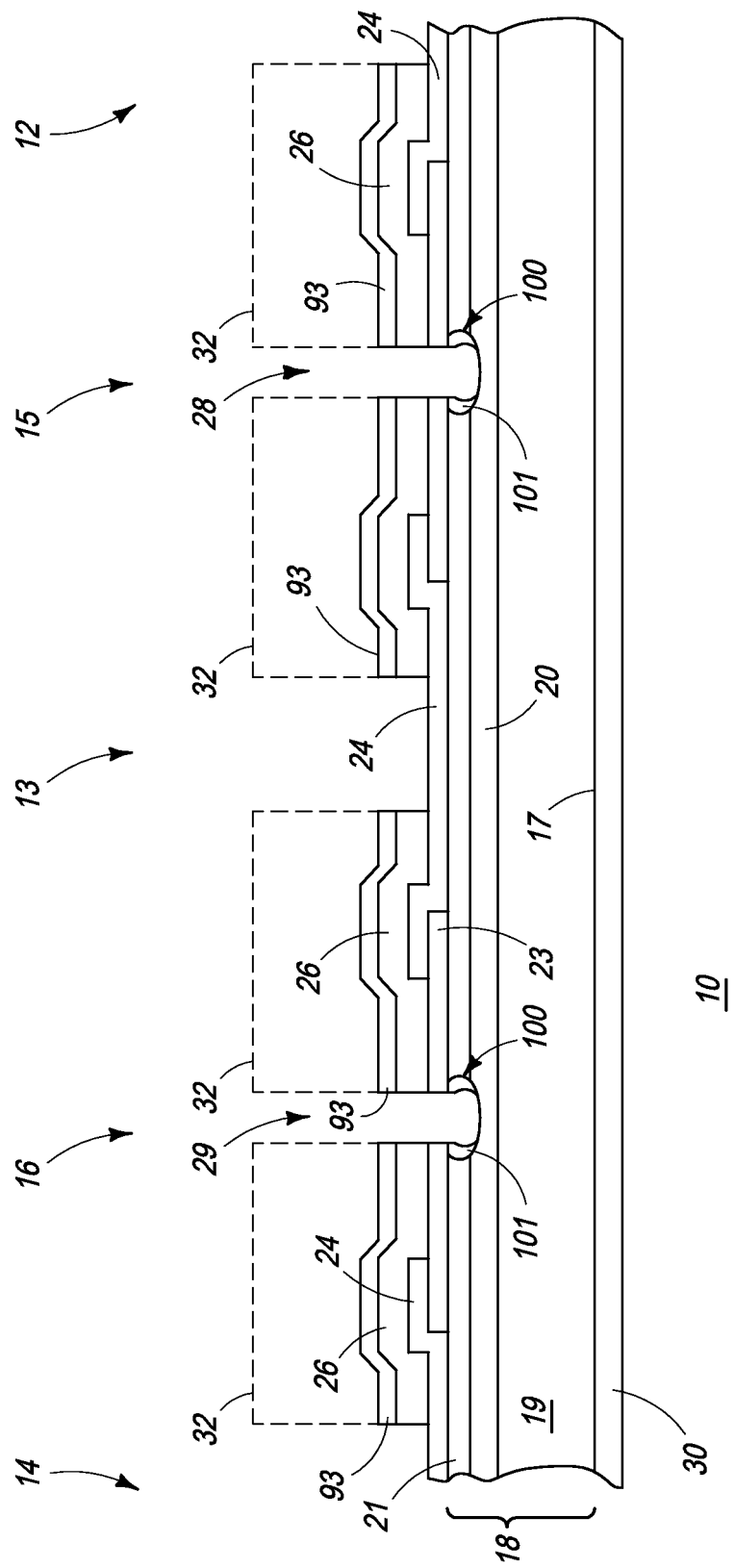

FIG. 6 illustrates a subsequent stage to the stage explained in the description of FIG. 5. An anisotropic etch is used to remove the portion of polymer 101 that is on the bottom of opening 100 while leaving the portion of polymer 101 on the sidewalls of opening 100.

Figure 7:
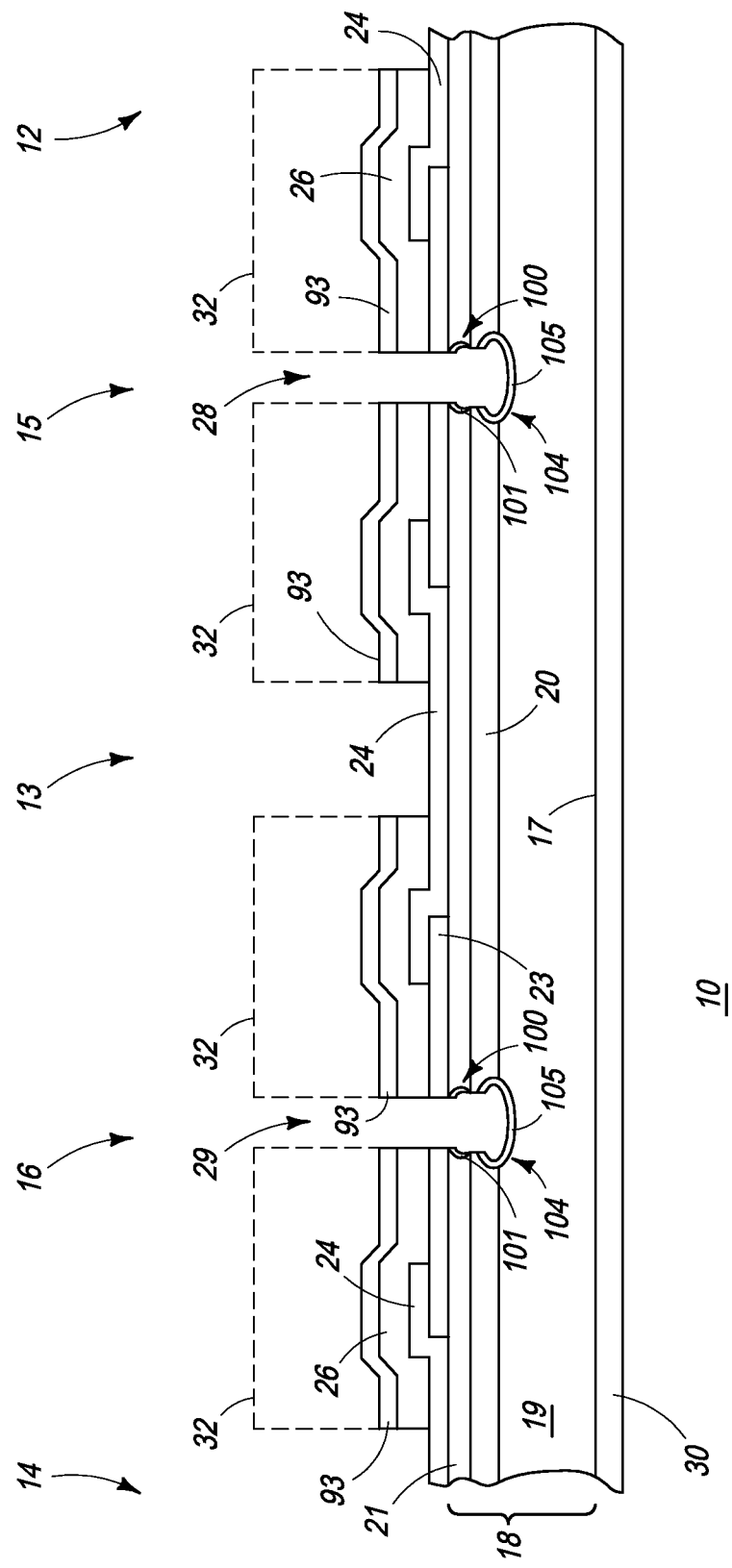

FIG. 7 illustrates a subsequent stage to the stage explained in the description of FIG. 6. The exposed surface of substrate 18 within opening 100, and any exposed pads 24, are etched with an isotropic etching process similar to the one describe in the explanation of FIG. 5. The isotropic etching again extends the width of singulation openings 28 and 29 laterally while also extending the depth to form opening 104 in substrate 18. The isotropic etch usually is terminated after the width of opening 104 is greater than the width of opening 100 in order to make the width of the openings wider as the depth increases. The portion of polymer 101 that was left on the sidewalls of opening 100 protects the sidewalls of opening 100 to prevent the etching of opening 104 from affecting the width of openings 100.

Thereafter, a carbon based polymer 105 that is similar to polymer 101 is applied to the portion of substrate 18 that is exposed within opening 104. During the formation of polymer 105, the operation usually forms polymer 101 again on the sidewalls of opening 100.

Figure 8:
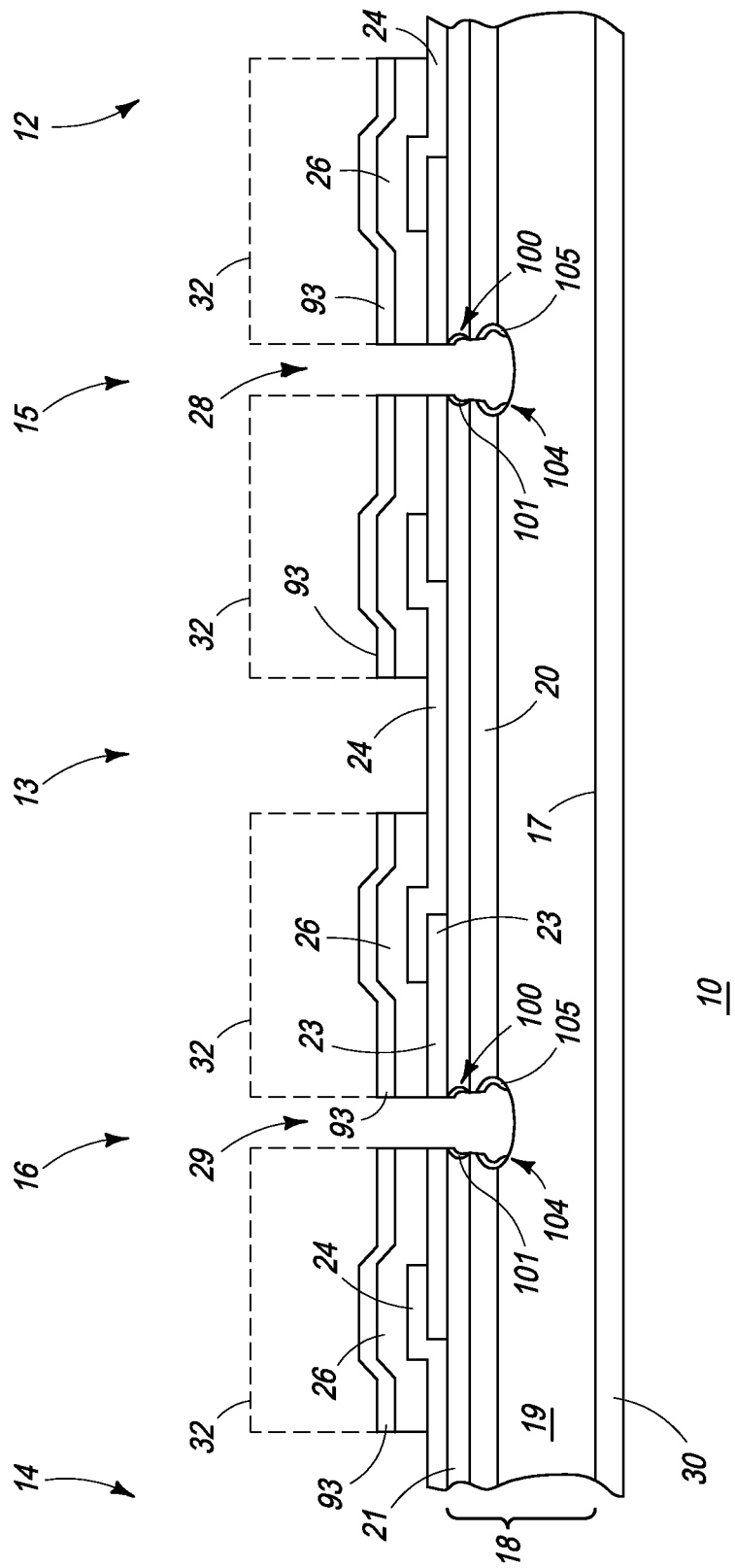

FIG. 8 illustrates a subsequent stage to the stage explained in the description of FIG. 7. An anisotropic etch is used to remove the portion of polymer 105 that is on the bottom of opening 104 while leaving the portion of polymer 105 on the sidewalls of opening 104. This process step is similar to the step explained in the description of FIG. 6.

Figure 9:
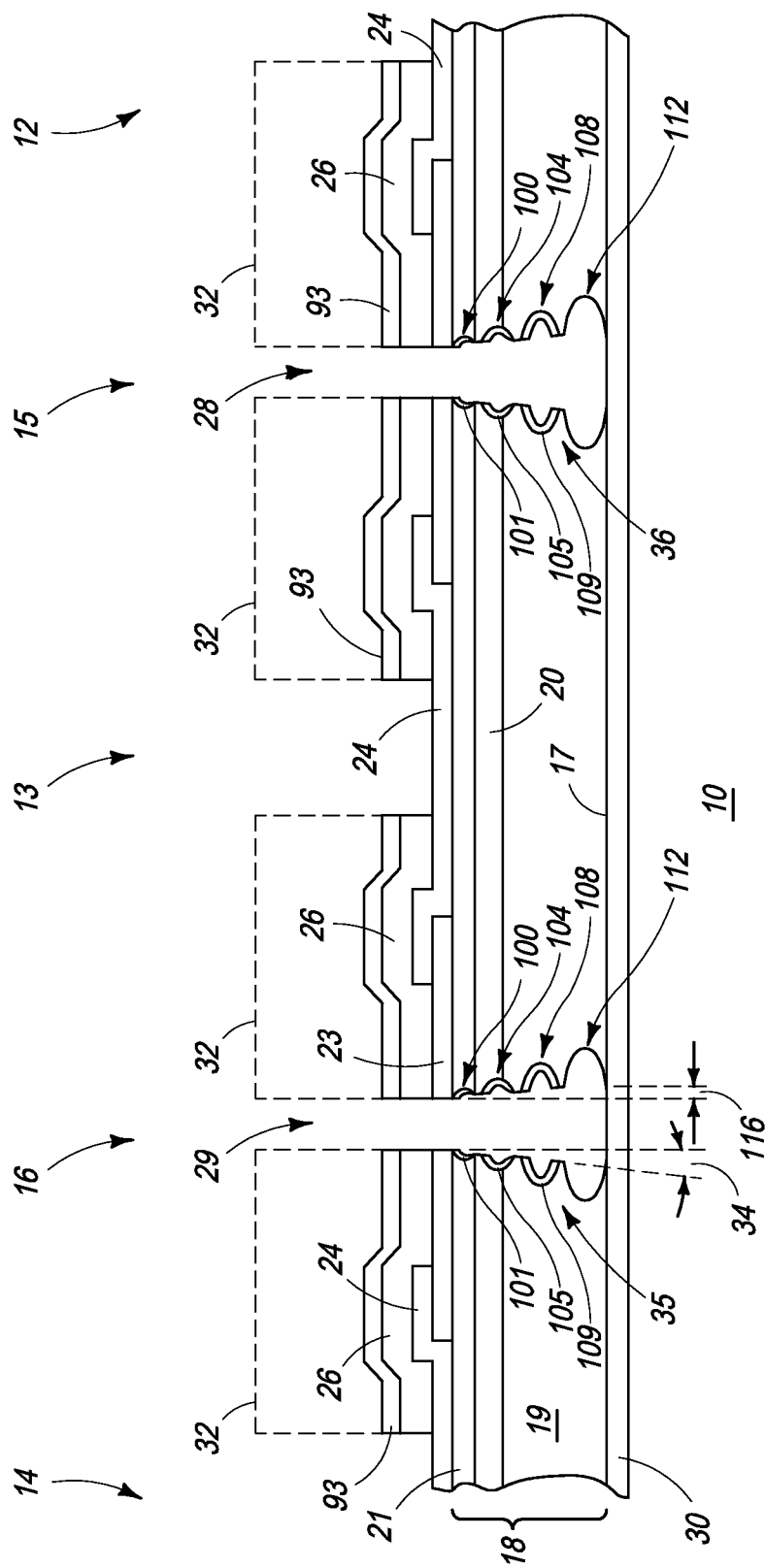

FIG. 9 illustrates that the sequence may be repeated until the opening of singulation lines 15 and 16 is formed to extend completely through substrate 18. The sequence of anisotropic etching to form an opening (such as openings 108 and 112), forming a polymer on the sidewalls of the opening (such as polymer 109, and removing the polymer from the bottom of the openings while leaving a portion of the polymer on the sidewalls (such as polymer 109) can be repeated until openings 28 and 29 are extended through substrate 18 to form singulation lines 15 and 16 completely through substrate 18.

After the last isotropic etch, such as the etch to form opening 112, the polymer usually is not deposited because it generally will not be needed to protect substrate 18 during subsequent operations. Although polymers 101, 105, and 109 are illustrated on the sidewalls of respective openings, 100, 104, and 108, after the completion of all operations, those skilled in the art will appreciate that the last isotropic etch step, such as the etch that forms opening 112, may be used to substantially remove these polymers from the sidewalls of the corresponding openings. Thus, these polymers are shown only for clarity of the explanation.

As can be seen from FIG. 9, sidewalls 36 of die 13 and sidewalls 35 and 37 of respective die 12 and 14 slope inwardly from top surface 11 to the bottom so that the width of the die at the bottom of each die is less than the width of the die at the top of the die. Thus, the outside edge of the die at the top of substrate 18 extends a distance 116 past the outside edge of the die at the top of substrate 18, thus, the top surface of die 13 overhangs bottom surface 17 by distance 116. In one embodiment, it is believed that distance 116 should be approximately five to ten percent (5-10%) of the thickness of die 12, 14, and 16. In one example embodiment, distance 116 is approximately one to twenty (1-20) microns, thus the width of the bottom of die 12 at the bottom of substrate 18 could be approximately two to forty (2-40) microns less than the width at the top of die 12 at surface 11. In another embodiment, it is believed that the sidewall should form an angle of approximately fifteen to forty degrees (15°-40°) between the sidewall and a vertical line, such as a line perpendicular to the top surface of substrate 18. Therefore, the amount that each etch extends the width of opening 29 should be sufficient to form angle 34. Generally, the top of singulation lines 15-16 is about five to twenty (5-20) microns narrower than the bottom of the singulation lines. Those skilled in the art will appreciate that the multiple anisotropic etch operations forms a rough sidewall of each die 12-14 so that the sidewall has a jagged edge along the sidewall. However, the extent of the jagged edges is exaggerated in the illustrations of FIGS. 5-9 for clarity of the explanation. These sidewalls are subsequently shown as and regarded as substantially smooth sidewalls.

AlN 93 protects dielectric 26 from being affected by the etching that was performed during the steps explained in the description of FIGS. 5-9. AlN 93 may have a thickness of about fifty to three hundred (50-300) Angstroms and still protect dielectric 26. Preferably, ALN 93 is about two hundred (200) Angstroms thick. Because AlN 93 is a dielectric, it may be left on die 12-14 after the singulation is complete. In other embodiments, AlN 93 may be removed after etching through substrate 18 such as by using the developer solution; however, this requires additional processing steps. Using the photo mask developer to remove the exposed portions of layer 91 saves processing steps thereby reducing the manufacturing costs. Using AlN 93 as a mask protects dielectric 26 from being effected by the etching operations.

In other embodiments, the singulation mask may be formed from other materials instead of ALN. Those other materials for the singulation mask are materials that are not substantially etched by the process that is used to etch the silicon of substrate 18. Since the etching procedure used to etch substrate 18 is an etch that etches silicon faster than metals, a metal compound may be used as the material to form the singulation mask. Examples of such metal compounds included, AlN, titanium nitride, titanium oxide, titanium oxynitride, and other metal compounds. In the example of using a metal compound other than AlN, a layer of the metal compound could be applied similarly to layer 91. Then mask 32 may be used to pattern the metal compound layer to form openings in the metal compound. Thereafter, mask 32 may be removed and the remaining portions of the metal compound could protect underlying layers, such as dielectric 26, during the etching of substrate 18. These metal compounds may be left on the die subsequent to singulation or may be removed prior to complete singulation, such as prior to separating the die from tape 30.

Also a silicon-metal compounds may also be used to form the singulation mask because the metal in the metal-silicon compound prevents the etch from proceeding into the metal-silicon material. Some examples of silicon-metal compounds include metal silicides, such as titanium silicide, and aluminum silicide. For the embodiment of a silicon-metal compound, a layer of the silicon-metal compound may be formed and patterned similarly to the example of the metal compound. However, the metal-silicon compound is generally a conductor, so it would typically be removed from the die, such as removing the metal-silicon compound prior to the complete singulation of the die form tape 30.

Also, a polymer may be used for the singulation mask. One example of a suitable polymer is polyimide. Other well-known polymers may also be used. The polymer may be patterned similarly to the metal compound and then may be removed or left on the die.

Those skilled in the art will appreciate that in another alternate embodiment of the method of singulating die 12-14, the singulation mask layer may be omitted. In such a case, the isotropic and anisotropic etch procedures use an etch that etches silicon faster than dielectrics or metals, thus, dielectric 26 provides protection for underlying portions of each of die 12-14. See United State s patent publication no. 2009/0042366 of inventor Gordon M. Grivna that was published on Feb. 12, 2009.

Figure 10:
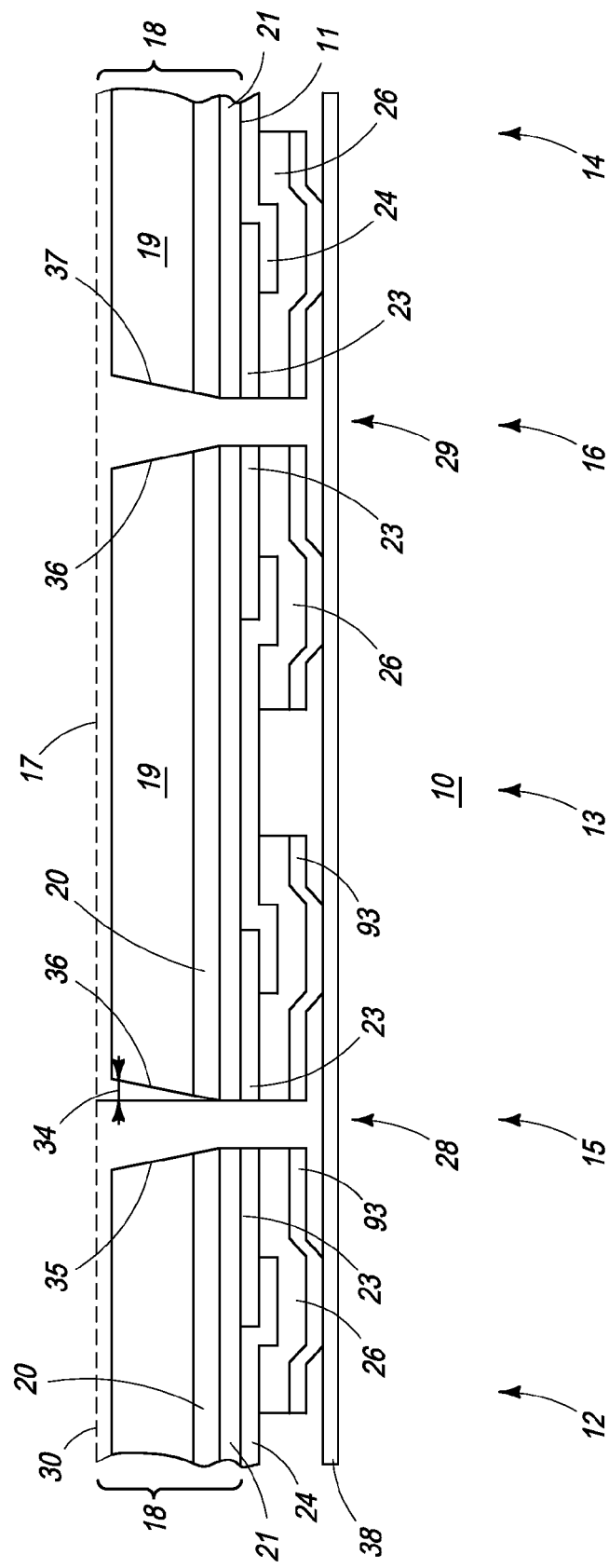
FIG. 10 illustrates another subsequent stage in the example process of forming the die of FIG. 1 in accordance with the present invention.

FIG. 10 illustrates the cross-sectional portion of wafer 10 of FIG. 9 at a subsequent stage in an example of an embodiment of a method of singulating die 12-14 from wafer 10. After singulation lines 15 and 16 are formed through substrate 18, die 12-14 are inverted in order to allow conductor 40 to be formed. One method of inverting die 12-14 is to apply a second a common carrier substrate or common carrier such as a transport tape or carrier tape 38 to the side of die 12-14 that is opposite to tape 30. The structure comprised of the die, tape 30 on the bottom of the die, and tape 38 on the top of the die may be inverted so that top surface 11 of die 12-14 is facing downwardly. Thereafter, carrier tape 30 may be removed as illustrated by the dashed lines in the place where tape 30 was attached to die 12-14. Tape 38 facilitates supporting die 12-14 during the step of inverting the die and after tape 30 is removed. In the preferred embodiment, tape 30 is an ultra-violet (UV) release type of tape that causes tape 30 to release die 12-14 upon exposing tape 30 to UV light. In other embodiments, tape 30 may have other release mechanisms instead of the UV light release mechanisms.

Referring back to FIG. 1, after tape 30 is removed, conductor 40 may be formed on the bottom surface of die 12-14 and on sidewalls 35-37 of respective die 12-14. Because die 12-14 are attached to tape 38, a low temperature process generally is used to form conductor 40. For example, a metal may be applied using a chemical vapor deposition (CVD) or a low temperature sputtering or evaporation method. The material used for conductor 40 generally is a material that can be applied a low temperatures, such as below about three hundred degrees Celsius (300° C.), is used in order to prevent affecting the doping profiles or charge concentrations of the semiconductor die. Preferably, conductor 40 is applied at a temperature that is less than approximately seventy-five to one hundred thirty degrees Celsius (75-130° C.). For example, a metal such as Au or CU or AlCU or a multi-layer metal structure such as Ti/NiV/Au or Ti/Ni/Au or TiW/Au or other well-known multi-layer metal structure may be used. In the preferred embodiment, a three layer metal structure of Ti/Ni/Au is applied using a low temperature plasma vapor deposition (PVD) process at a temperature that is no greater than about one hundred twenty-five to one hundred fifty degrees Celsius (1250-150° C.). Because singulation lines 15 and 16 form the angled sidewalls for die 12-14, singulation lines 15-16 have a wider opening at the bottom of lines 15-16. In the inverted state illustrated in FIG. 10, the wider opening is at the top and facilities the material of conductor 40 penetrating into the opening formed by the singulation lines. Because of the sloped sidewalls, the angled or sloped sidewalls of die 12-14 are exposed to the conductor material as it travels into the opening of singulation lines 15 and 16. Thus, the material of conductor 40 is able to adhere to sidewalls 35-37 and to the bottom of die 12-14. Generally, the top of singulation lines 15-16 is about five to twenty (5-20) microns narrower than the bottom of the singulation lines. Angle 34 is formed to provide sufficient exposure of the sidewalls to form conductor 40 on the sidewalls, such as sidewall 36. Thus, angle 34 depends on the type of equipment that is used to form conductor. As indicated hereinbefore, it is believed that an angle of fifteen to forty degrees (15°-40°) is usually sufficient. In the preferred embodiment, angle 34 is about thirty degrees (30°).

In some embodiments, polymers 101 and 105 electrically insulate conductor 40 from doped region 21 and epitaxial layer 20, and polymers 105, 108 may electrically isolate the sidewalls of substrate 18 from conductor 40. In other embodiments, all or some the polymers may be removed prior to forming conductor 40 and other methods may be used to insulate conductor 40 from doped region 21 and epitaxial layer 20. For example, region 21 and layer 20 may be removed from the region adjacent to openings 28 and 29 prior to forming dielectric 23, or an isolation trench may be formed through region 21 and layer 20 near to where openings 28 and 29 are to be formed so that the portion of region 21 and layer 20 that abut conductor 40 are isolated from other portions of region 21 and layer 20 by the trench. In other embodiments, region 21 and layer 20 may be omitted and the insulation may not be required.

Conductor 40 can be electrically coupled to a connection on the topside of the die, such as die 13, if desired. For example, conductor 40 can extend along at least one of the sidewalls and be coupled to a contact pad, such as pad 24, on the top surface of die 13. For example, conductor 40 can extend along sidewall 35 and onto the surface of substrate 18 and across the top surface of die 13, typically under dielectric 26, to contact pad 24. The contact pad can be one that is intended to be connected to a common reference voltage, such as a ground reference, or other electrical potential or to a signal connection. Alternately, conductor 40 can be attached to a drain contact pad of an MOS transistor that is formed on die 13 in order to form a backside contact for the drain.

In prior methods of singulating die, the singulation lines had substantially vertical sidewalls. Those skilled in the art will understand that it would be very difficult to form a conductor on such substantially vertical sidewalls. Thus, the method of forming angled sidewalls for die 12-14 facilitates forming conductor 40 on the sidewalls and on the bottom of die 12-14.

Because conductor 40 is a conductor material, conductor 40 provides die 12-14 protection from EMI. Forming sloped sidewalls during the singulation process, facilitates forming conductor 40 on die 12-14 without moving one of the die laterally or vertically from the other die to separate the die from each other thereby minimizing assembly steps and reducing the costs of an EM protected semiconductor die. Conductor 40 provides EM protection without forming special conductors in the package that encapsulates die 12-14 thereby reducing the packaging costs.

In order to form external connections to die 12-14 and/or to assemble die 12-14 into a semiconductor package, another carrier tape similar to tape 30 may again be applied to the backside of die 12-14. Thereafter, tape 38 usually is removed, such as by exposing tape 38 to UV light. Thereafter, die 12-14 may be removed from the carrier tape by standard pick-and-place equipment.

Figure 11:
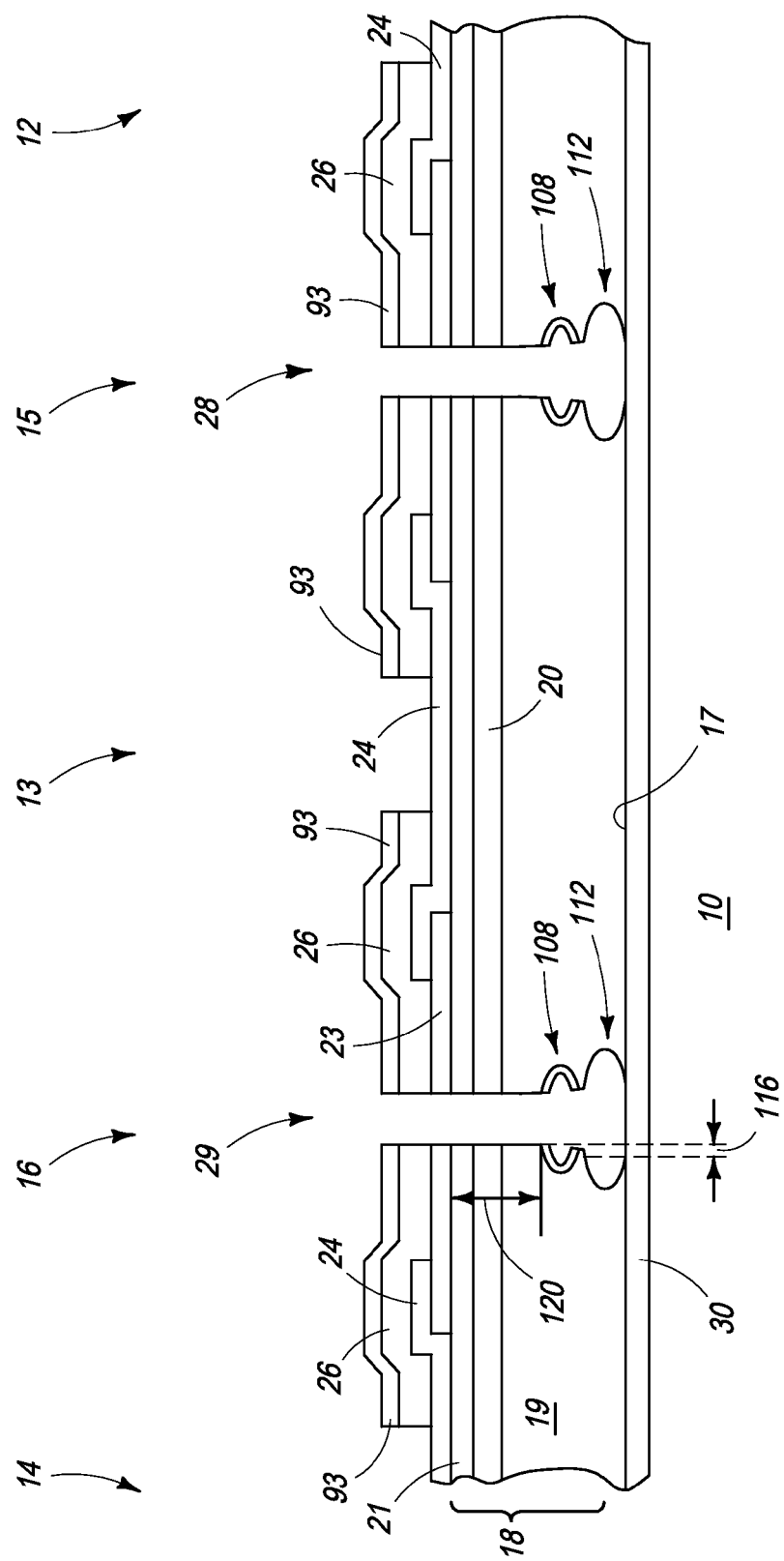
FIG. 11 illustrates an enlarged cross-sectional view of an embodiment of an example of another method of forming semiconductor die in accordance with the present invention.

FIG. 11 illustrates a stage in an example of an embodiment of another alternate method of singulating semiconductor die 12-14 and forming angled or sloped sidewalls that were explained in the description of FIGS. 1-10. The description of FIG. 11 begins with wafer 10 and die 12-14 as explained in the description of FIG. 4.

Thereafter, an anisotropic etch may be used to form openings 28 and 29 a first distance 120 from the top surface of substrate 18 into substrate 18. This first distance of the sidewalls has substantially straight sidewalls because an anisotropic etch was used. Subsequently, the singulation method explained in the description of FIGS. 5-10 may be used to complete the singulation. The depth of the first distance depends on the thickness of the die, but typically would be at least fifty percent (50%) of the thickness of the die. Thereafter, a plurality of the sequences of anisotropic etching to form an opening (such as openings 108 and 112), forming a polymer on the sidewalls of the opening, and removing the polymer from the bottom of the openings while leaving a portion of the polymer on the sidewalls (such as polymers 109 and 113) can be repeated until openings 28 and 29 are extended through substrate 18 to form singulation lines 15 and 16 completely through substrate 18.

Figure 12:
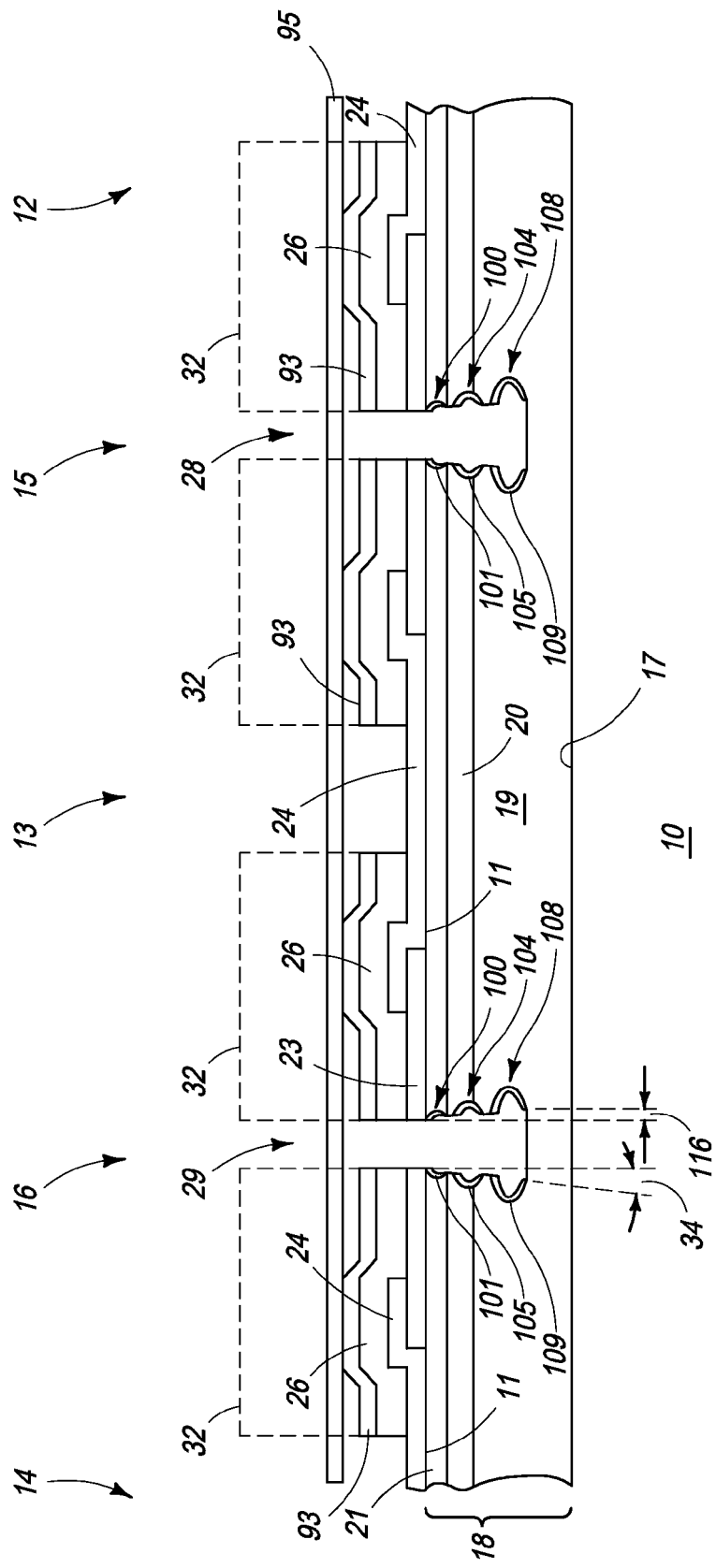
FIGS. 12-13 illustrate stages in an example of an alternate embodiment of a method of singulating semiconductor die and forming angled or sloped sidewalls in accordance with the present invention.
Figure 13:
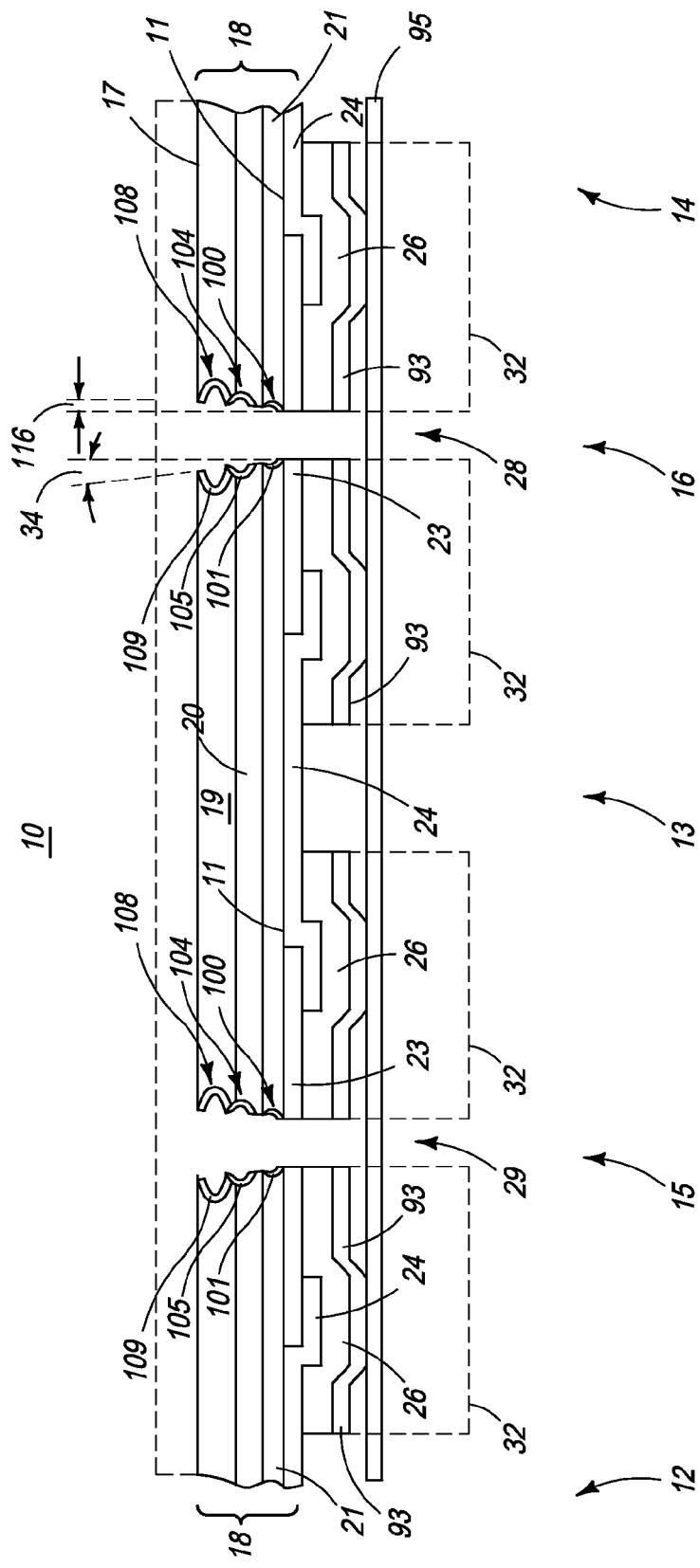

FIGS. 12-13 illustrate stages in an example of an alternate embodiment of a method of singulating semiconductor die 12-14 and forming angled or sloped sidewalls. FIG. 12 illustrates that in this example description of the alternate embodiment, openings 15 and 16 are formed for a distance into substrate 18 but do not extend through substrate 18 to bottom surface 17. For example, openings 100, 105, and 108 may be formed in order to form openings 28 and 29 a distance into substrate 18. The distance usually is chosen to be a distance that causes openings 15 and 16 to be exposed upon reducing the thickness of wafer 18. For example, the distance may be approximately one-third to two-thirds of the distance through substrate 18. A tape carrier 95 is attached to the top of wafer 10 so that the top surface of substrate 10 faces carrier 95.

Referring to FIG. 13, wafer 10 is inverted and the thickness of substrate 18 and wafer 10 is reduced until openings 15 and 16 are intersected thereby forming openings 15 and 16 through substrate 18. The removed portion of substrate 18 is illustrated by dashed lines. The thickness of substrate 18 may be reduced by a variety of well known means including methods referred to in the art as backgrinding, chemical mechanical polishing (CMP), etc.

Figure 14:
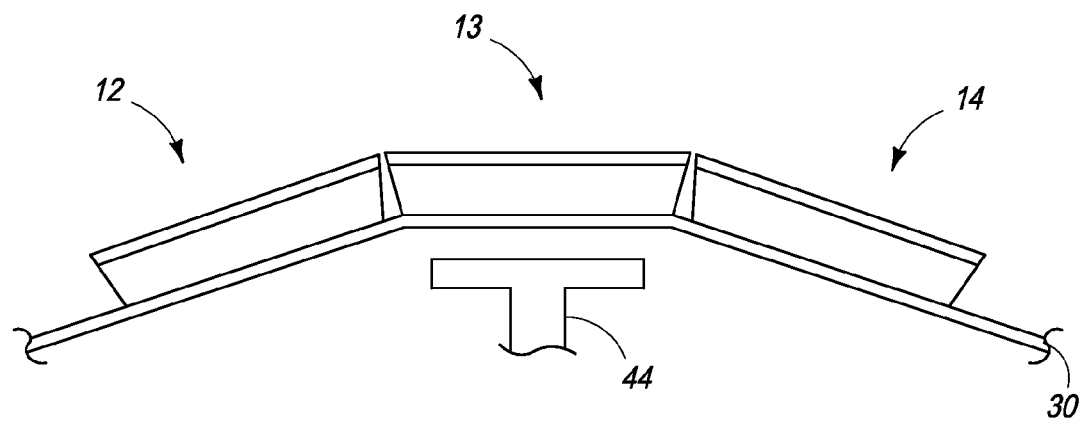
FIG. 14 illustrates a stage in an example embodiment of an assembly method that uses the semiconductor die of FIG. 1 and FIG. 11 in accordance with the present invention.

FIG. 14 illustrates die 12-16 with the inwardly sloped sidewalls during a pick-and-place operation. The angled sidewalls also assist in minimizing damage to die 12-14 during the pick-and-place portion of the assembly operation. As can be seen, the sloped sidewalls of die 12-14 allow pick-and-place plunger 44 to move one of the die, such as die 13, upwardly without the die bumping into the other dice, such as dice 12 or 14. This helps reduce chipping and other damage to die 12-14 during the pick-and-place operation.

Figure 15:
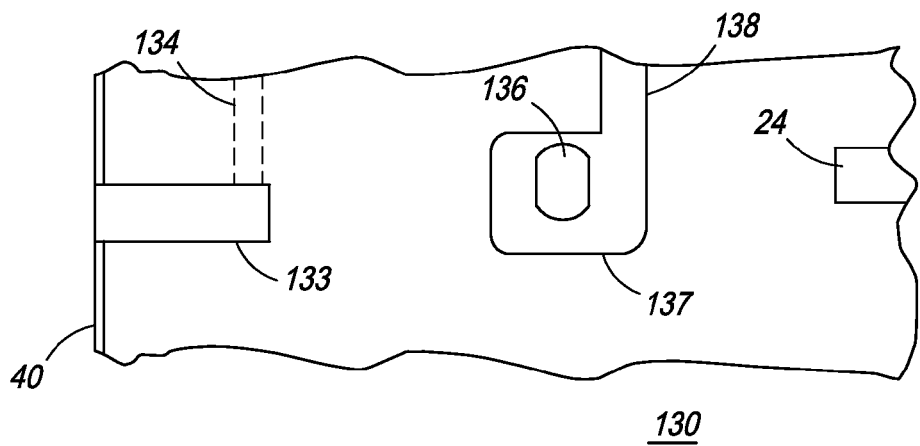
FIG. 15 illustrates an enlarged plan view of a portion of one example of an embodiment of a semiconductor die in accordance with the present invention.

FIG. 15 illustrates an enlarged plan view of a portion of one example of an embodiment of a semiconductor die 130. In some embodiments die 130 is formed on wafer 10 and may be similar to die 13. Die 130 may include a conductor 133 on the upper side of die 130 that makes an electrical connection to the bottom surface of die 130. Conductor 133 also may be electrically connected to portions of the electrical elements formed on the surface of substrate 18, such as being electrically connected to a transistor or a passive electrical element such as a resistor, etc. Conductor 133 may also be connected to a routing conductor 134 that can route conductor 133 to other electrical elements of die 130. Conductor 134 is illustrated in dashed lines because it is optional. Die 130 also may include a via 137 that forms an electrical connection from the upper side of die 130 to the back surface of die 130. Via 137 generally includes a conductor that may have an opening 136 through the material of the conductor. The material of via 137 generally is a metal. Opening 136 may also be positioned in a different relationship to the body of via 137, such as along an outside edge or at a corner of via 137. Via 137 may also be electrically connected to portions of electrical elements that are formed on die 130 or on the top surface of substrate 18, such as being electrically connected to a transistor or a passive electrical element such as a resistor, etc. Via 137 may also be connected to a routing conductor, such as an optional conductor 138, that can route via 137 to other electrical elements of die 130. In some embodiments, either or both of conductor 133 and via 137 may be omitted.

Figure 16:
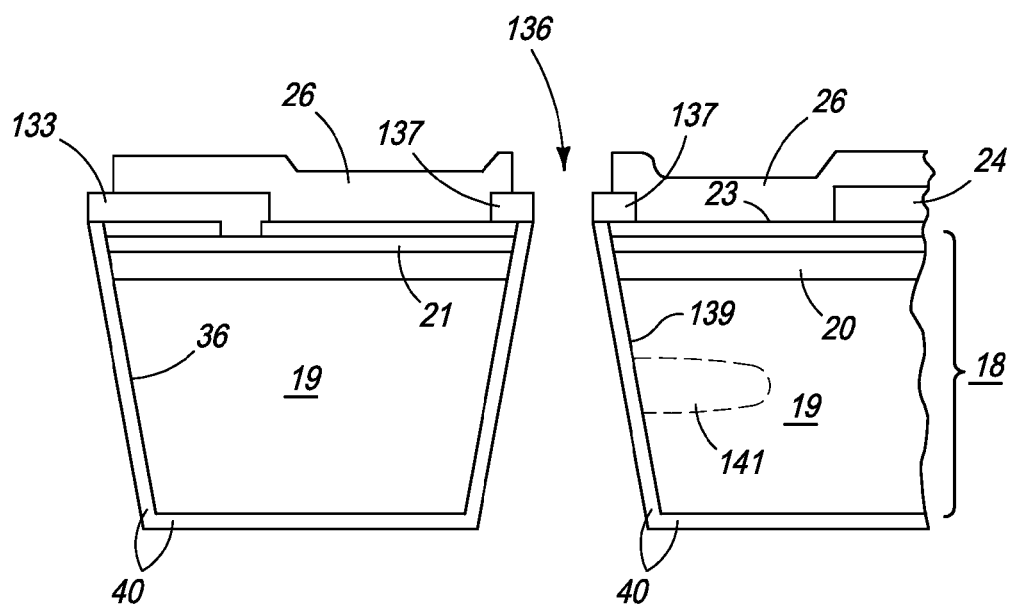
FIG. 16 illustrates an enlarged cross-sectional view of the semiconductor die of FIG. 15 in accordance with the present invention; and FIG. 17

FIG. 16 illustrates an enlarged cross-sectional view of die 130. The material of via 137 is formed to be electrically connected to a conductor along a sidewall of opening 136, such as conductor 40, in order to form an electrical connection from the upper surface of die 130 to the bottom surface of die 130. Via 137 overlies the top surface of substrate 18 but generally is not on the top surface of die 130, such as on top of dielectric 26.

Figure 17:
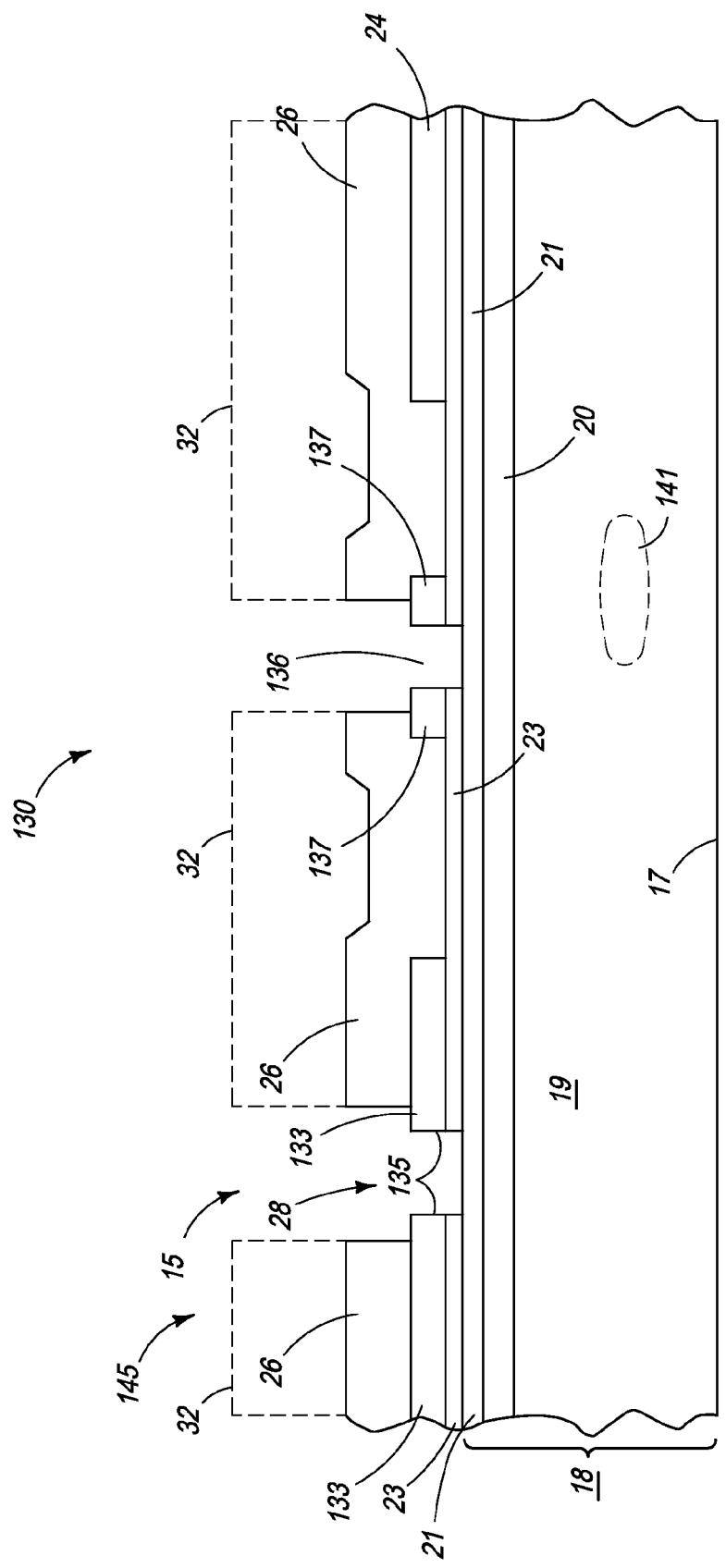

FIG. 17 illustrates an enlarged a cross-sectional view of wafer 10 where die 130 is to be formed. Wafer 10 also usually includes other die, such as a die 145, that are separated from die 130 by regions where singulation lines are to be formed. After forming dielectric 23, a conductor material may be applied and patterned to form conductor 133 and at least the body portion of via 137 that is on the upper portion of die 130. Typically, a metal is applied and then patterned to form conductor 133 and via 137. Conductor 133 is patterned to have one edge adjacent to or extending into the region where a singulation line, such as singulation line 15 is to be formed such that opening 28 is formed with conductor 133 along at least one side of opening 28. The patterning also may form opening 136 though the material of via 137 to expose the underlying portion of dielectric 23. Conductor 133 is patterned to expose dielectric 23 that is within the region where line 15 is to be formed. In some embodiments, dielectric 23 may not be formed within this region so that a different material is exposed. Typically, the material of conductor 133 and via 137 is applied and then a mask (not shown) is used to pattern the material to form conductor 133 and via 137.

Subsequently, dielectric 26 is formed in a pattern having openings overlying opening 136 and the region where line 15 is to be formed, such as opening 28. The pattern in dielectric 26 exposes a portion of conductor 133 including a distal edge 135 that is adjacent to where line 15 is to be formed, such as adjacent to opening 28. The pattern of dielectric 26 also exposes a portion of the material of via 137 that is adjacent to opening 136. Typically, the material of dielectric 26 is applied, then mask 32 may be applied and used as a mask to form the pattern of dielectric 26. Mask 32 is formed to have openings that facilitate forming the pattern of dielectric 26. Mask 32, conductor 133 and via 137 may be used as a mask to etch dielectric 23 as described hereinbefore and extend openings 28 and 136 through dielectric 23. In the preferred embodiment, the etch is an anisotropic process that selectively etches dielectrics faster than it etches metals or silicon as described hereinbefore. The etching process generally etches dielectrics at least ten (10) times faster that it etches metals and silicon as described hereinbefore. The etching exposes a portion of the surface of substrate 18 within openings 28 and 136.

Figure 18:
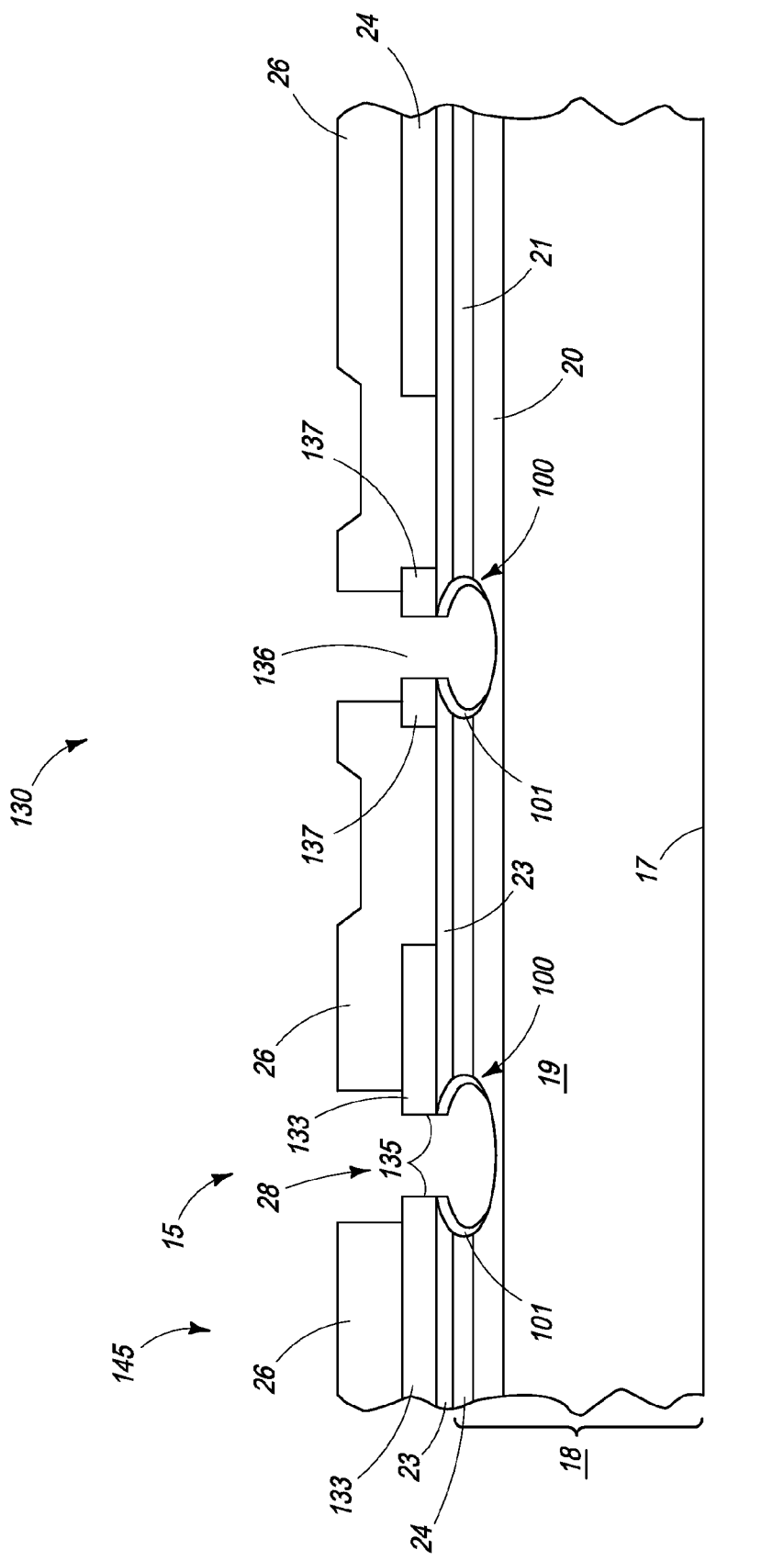

FIG. 18 illustrates wafer 10 at a subsequent state of one example of an embodiment of a method of forming die 130. Substrate 18 and any exposed portions of conductor 133 and via 137 are etched with an isotropic etching process that selectively etches silicon at a much higher rate than dielectrics or metals as explained hereinbefore. The etch process is performed to extend openings 28 and 136 into substrate 18 to a depth that extends the width of the openings laterally while also extending the depth to form openings 100 in substrate 18. The etching removes a portion of substrate 18 that underlies edge 135 of conductor 133 and the edge of via 137 that is adjacent to opening 136. The process forms opening 100 as explained hereinbefore.

Figure 19:
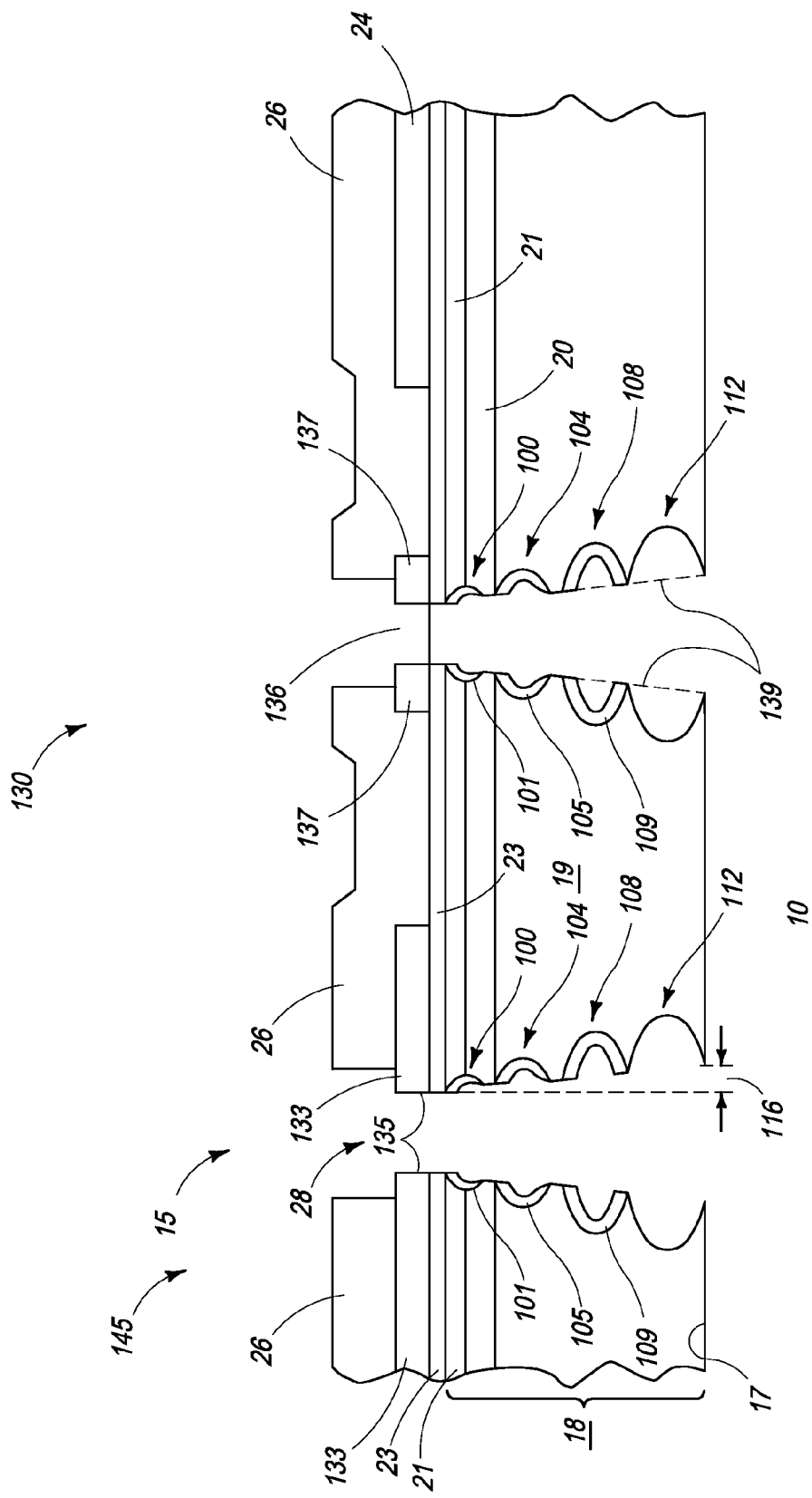
-FIG. 19 illustrates examples of stages of an embodiment of a process of forming the semiconductor die of FIG. 15 and FIG. 16 in accordance with the present invention.

FIG. 19 illustrates wafer 10 at a subsequent stage of one example of an embodiment of a method of forming die 130. Opening 28 and 136 are extended further into substrate 18, and preferably through substrate 18, by forming openings 104, 108, and 112 as explained hereinbefore. Forming openings 104, 108, and 112 to extend opening 136 forms sidewalls 139 of opening 136.

Referring back to FIGS. 15 and 16, conductor 40 is formed on sidewall 36 of substrate 18 and die 130, and is also formed on sidewall 139 of opening 136 as explained hereinbefore. Forming openings 104, 108, and 112 to extend opening 28 exposes the sidewall of conductor 133 and preferably exposes a portion of an underside of conductor 133 within opening 28. Because a portion of conductor 133 is exposed within opening 28, forming conductor 40 causes conductor 40 to touch at least the sidewall, and preferably the underside, of conductor 133 thereby forming an electrical connection between conductors 40 and 133. Thus, an electrical connection is formed between the bottom surface of substrate 18 and elements on the upper surface of substrate 18. Also, forming openings 104, 108, and 112 to extend opening 136 exposes a sidewall of the body of via 137 that is adjacent to opening 136 and preferably exposes a portion of an underside of via 137 within opening 100. Because a portion of via 137 is exposed by opening 100, forming conductor 40 causes conductor 40 to touch at least the sidewall, and preferably the underside, of the material of via 137 thereby forming an electrical connection between via 137 and conductor 40. Forming an electrical connection between via 137 and the bottom surface of substrate 18 forms a low resistance electrical connection between elements on the upper surface of substrate 18 and the bottom of substrate 18. Such a connection has a much lower resistance than connections that use doped regions of substrate 18 to form an electrical connection between the top and bottom portions of substrate 18, and the low resistance connection can also have lower capacitance and inductance.

Additionally, those skilled in the art will appreciate that conductor 40 may also be used to form an electrical connection to regions within substrate 18 such as to layer 20 or to other doped regions buried within substrate 18 such as an optional doped region 141 (illustrated by dashed lines) or a buried layer within substrate 18.

Further, those skilled in the art will appreciate that via 137, opening 136 and the conductor on sidewall 139 may be formed without forming conductor 40 on either of the bottom surface of substrate 18 or on sidewall 36. Additionally, opening 136 may be formed from the bottom surface through substrate 18 so that the end of opening 136 at via 137 would be wider that the end at the bottom of substrate 18.

One skilled in the art will appreciate that one example method of forming a semiconductor die includes: providing a semiconductor wafer, such as wafer 10, having a semiconductor substrate, such as substrate 18, and having a plurality of semiconductor die, such as die 12-14, formed on the semiconductor substrate and separated from each other by portions of the semiconductor substrate where singulation lines, for example singulation lines 13 and 15,) are to be formed, the semiconductor substrate having a first surface and a second surface;

forming an opening, for example opening 136, through a first semiconductor die, die 130 for example, of the plurality of semiconductor die wherein the opening has sloped sidewalls so that a width of the opening is greater at one end of the opening than at an opposite end of the opening; and forming a first conductor, such as conductor 40, on the sloped sidewalls of the opening.

Alternately, the method may also include, undercutting, such as undercutting some of the conductor material of via 137, a portion of the semiconductor substrate from under a first portion of the second conductor, such as the conductor of via 137, and forming the first conductor on the sloped sidewalls to abut the second portion, such as the overhanging portion of the conductor of via 137, of the second conductor.

Those skilled in the art will understand that the descriptions herein describe an example of an embodiment of a semiconductor die that includes: a semiconductor substrate having a first surface and a second surface; an opening, opening 136 for example, extending through the semiconductor substrate, such as substrate 18, the opening having sidewalls wherein at least one sidewall, such as sidewalls 139, is a sloped sidewall so that a width of a first end of the opening is greater than a width of an opposite end of the opening; and a first conductor, such as conductor 40, on the sloped sidewall.

In view of all of the above, it is evident that a novel device and method is disclosed. Included, among other features, is forming singulation openings completely through a semiconductor wafer that includes a plurality of semiconductor die. Typically, a dry etch procedure is used to form the singulation openings. Such dry etch procedures are generally referred to as plasma etching or reactive ion etching (RIE). Forming the sloped sidewalls on the semiconductor die facilitate forming a conductor on the sidewalls. The conductor on the sidewalls provides EM protection reduces the cost devices that use the semiconductor die. The electrical connection from the top side of a die to the bottom surface, such as the example embodiment of die 130, also provides a low resistance connection from element on the top side to the bottom side of the die. All of the singulation lines are generally formed simultaneously, thus, the sloped sidewalls usually are formed on all of the die simultaneously. However, in some embodiments some of the sidewalls may not be sloped.

While the subject matter of the invention is described with specific preferred and example embodiments, it is evident that many alternatives and variations will be apparent to those skilled in the semiconductor arts. For example, layers 20 and/or 21 may be omitted from substrate 18. The singulation openings alternately may be formed prior to or subsequent to forming the contact openings overlying pads 24. Also, the singulation openings may be formed before thinning wafer 10, for example, the singulation openings may be formed partially through substrate 18 and the thinning process may be used to expose the bottom of the singulation openings. Alternately, the conductor may be formed on the sidewalls but not on the bottom of the semiconductor die.

The invention claimed is:

1. A semiconductor die comprising:
a semiconductor substrate having a first surface and a second surface wherein the semiconductor substrate includes a bulk silicon semiconductor substrate and a silicon semiconductor material overlying the bulk silicon semiconductor substrate;
a doped region formed in at least a portion of the silicon semiconductor material;
an opening extending through the semiconductor die including through the bulk silicon semiconductor substrate and through the semiconductor material overlying the bulk silicon semiconductor substrate, the opening having sidewalls wherein the sidewalls include rough sidewalls and at least one sidewall is a sloped sidewall so that a width of a first end of the opening is greater than a width of an opposite end of the opening; and
a first conductor on the sloped sidewall.

2. The semiconductor die of claim 1 wherein the first conductor is on a second surface of the semiconductor die.

3. The semiconductor die of claim 2 further including a second conductor overlying the first surface with a first portion of the second conductor abutting the first conductor.

4. The semiconductor die of claim 3 wherein the second conductor is adjacent to the first end of the opening.

5. The semiconductor die of claim 1 wherein the first end of the opening is approximately two to ten microns wider than the width of the opposite end.

6. The semiconductor die of claim 1 wherein the first conductor is a metal including one of Au or a multi-layer metal or a multi-layer metal of Ti/NiV/Au or a multi-layer metal of Ti/Ni/Au or a multi-layer metal of TiW/Au.

7. The semiconductor die of claim 1 further including a second conductor overlying the first surface of the semiconductor substrate with a first portion of the second conductor abutting the first conductor.

8. The semiconductor die of claim 7 wherein the second conductor is a portion of a via.

9. The semiconductor die of claim 1 further including the semiconductor die having exterior sidewalls extending from the first surface to the second surface wherein at least one of the exterior sidewalls is a sloped exterior sidewall so that a width of the first surface is greater than a width of the second surface; and
the first conductor on the sloped exterior sidewall wherein at least a first portion of the first conductor forms an electrical connection to the sloped exterior sidewall.

10. The semiconductor die of claim 1 wherein the second end of the opening is at the second surface.

11. The semiconductor die of claim 9 further including a second conductor overlying the first surface of the semiconductor substrate with a portion of the second conductor extending to the sloped sidewall to abut the first conductor and form an electrical connection therebetween.

12. The semiconductor die of claim 7 further including a third conductor on the first surface and abutting the second conductor.

13. The semiconductor die of claim 1 wherein the first conductor includes a metal.

14. The semiconductor die of claim 1 wherein the opening is formed as at least a portion of forming another opening through the semiconductor substrate to singulate the semiconductor die from other semiconductor die formed on a semiconductor wafer.

15. The semiconductor die of claim 1 wherein the first opening extends from the first surface of the semiconductor substrate through the semiconductor substrate to the second surface of the semiconductor substrate.

* * * * *